(12) United States Patent
Jin et al.

(10) Patent No.: US 10,784,294 B2
(45) Date of Patent: Sep. 22, 2020

(54) IMAGE SENSOR INCLUDING MULTI-TAP PIXEL

(71) Applicant: Samsung Electronics Co., Ltd., Suwon-si, Gyeonggi-do (KR)

(72) Inventors: Young-gu Jin, Suwon-si (KR); Young-chan Kim, Seongnam-si (KR); Tae-sub Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/263,459

(22) Filed: Jan. 31, 2019

(65) Prior Publication Data

US 2020/0013811 A1 Jan. 9, 2020

(30) Foreign Application Priority Data

Jul. 9, 2018 (KR) .......................... 10-2018-0079574

(51) Int. Cl.
| | |
|---|---|
| *H01L 31/0232* | (2014.01) |
| *H01L 27/146* | (2006.01) |
| *H01L 27/148* | (2006.01) |
| *H04N 5/3745* | (2011.01) |
| *H04N 5/378* | (2011.01) |

(52) U.S. Cl.
CPC .. *H01L 27/14605* (2013.01); *H01L 27/14812* (2013.01); *H01L 27/14612* (2013.01); *H04N 5/378* (2013.01); *H04N 5/37452* (2013.01); *H04N 5/37457* (2013.01)

(58) Field of Classification Search
CPC ......... H01L 27/14605; H01L 27/14812; H01L 27/14612; H04N 5/37457; H04N 5/37452; H04N 5/378
USPC ........................................................ 257/432
See application file for complete search history.

(56) References Cited

U.S. PATENT DOCUMENTS

| | | | |
|---|---|---|---|
| 7,863,661 B2 * | 1/2011 | Katsuno ............ | H01L 27/14609 257/258 |
| 8,645,099 B2 | 2/2014 | Min et al. | |
| 8,760,549 B2 | 6/2014 | Lehmann et al. | |
| 9,055,242 B2 | 6/2015 | Kim et al. | |
| 9,167,230 B2 * | 10/2015 | Min ..................... | H04N 13/207 |
| 9,442,196 B2 | 9/2016 | Buettgen et al. | |
| 2016/0306045 A1 | 10/2016 | Van Der Tempel et al. | |
| 2017/0131405 A1 | 5/2017 | Bae et al. | |

* cited by examiner

*Primary Examiner* — Vu A Vu
(74) *Attorney, Agent, or Firm* — Harness, Dickey & Pierce, P.L.C.

(57) ABSTRACT

An image sensor includes unit pixels, and from among the unit pixels, a first unit pixel and a second unit pixel that are adjacent to each other each include a first tap having a first photo gate, to which a first signal having a first phase difference with respect to an optical signal is applied, and a second tap having a second photo gate, to which a second signal having a second phase difference with respect to the optical signal is applied. A location of the first tap in the first unit pixel and a location of the first tap in the second unit pixel, and a location of the second tap in the first unit pixel and a location of the second tap in the second unit pixel are symmetrical with each other based on one point between the first unit pixel and the second unit pixel.

20 Claims, 22 Drawing Sheets

IMAGE SENSOR INCLUDING MULTI-TAP PIXEL

CROSS-REFERENCE TO RELATED APPLICATION

This U.S. non-provisional application claims the benefit of priority under 35 U.S.C. § 119 to Korean Patent Application No. 10-2018-0079574, filed on Jul. 9, 2018, in the Korean Intellectual Property Office (KIPO), the disclosure of which is incorporated herein in its entirety by reference.

BACKGROUND

Various example embodiments of the inventive concepts relate to an image sensor, a system including the image sensor, a method of operating the image sensor, and/or a non-transitory computer readable thereof, and more particularly, to an image sensor including a multi-tap pixel.

In a time-of-flight (ToF) image sensor of a modulation type, light is irradiated to an object within a measurement range, and after that, a time taken for reflection pulses of the light from the object to reach a receiver is calculated to obtain distance information. When a ToF image sensor adopts a multi-tap demodulation pixel structure, taps receiving an equal signal may have different sensitivities from one another in each unit pixel or tap asymmetry may occur, and thus, an error in the distance information may occur. Therefore, there is a need for developing a technique for addressing the above issues.

SUMMARY

Various example embodiments of the inventive concepts provide an image sensor capable of improving accuracy in distance information by decreasing and/or preventing an error in the distance information, which may be caused due to a sensitivity difference among taps receiving an equal signal and/or tap asymmetry in each unit pixel in a case where each unit pixel adopts a multi-tap demodulation pixel structure.

According to an aspect of at least one example embodiment of the inventive concepts, there is provided an image sensor including: a light source configured to output an optical signal onto at least one object, a pixel array comprising a plurality of unit pixels, the plurality of unit pixels including at least a first unit pixel and a second unit pixel that are adjacent to each other, each of the plurality of unit pixels comprising, a photoelectric conversion region configured to receive a optical signal off of the object in response to the output optical signal, a plurality of photo gates configured to receive a plurality of signals, phase differences of the plurality of signals being different from one another, the first unit pixel and the second unit pixel being adjacent to each other, and the first unit pixel and the second unit pixel each comprise, a first tap including a first photo gate, and the first tap configured to receive a first signal having a first phase difference with respect to the optical signal, and a second tap including a second photo gate, and the second tap configured to receive a second signal having a second phase difference with respect to the optical signal, the second phase difference being different from the first phase difference, and a location of the first tap in the first unit pixel and a location of the first tap in the second unit pixel, and a location of the second tap in the first unit pixel and a location of the second tap in the second unit pixel are symmetrical with each other based on one point between the first unit pixel and the second unit pixel.

According to another aspect of at least one example embodiment of the inventive concepts, there is provided an image sensor including: a light source configured to output an optical signal onto an object, a pixel array comprising a plurality of unit pixels, the pixel array including at least a first unit pixel, a second unit pixel, a third unit pixel, and a fourth unit pixel, and the first unit pixel, the second unit pixel, the third unit pixel, and the fourth unit pixel arranged in a 2×2 array arrangement, each of the plurality of unit pixels comprising a photoelectric conversion region configured to receive an optical signal off of the object in response to the output optical signal, a plurality of photo gates configured to receive a plurality of signals, phase differences of plurality of signals being different from one another, each of the first unit pixel and the second unit pixel being adjacent to each other in a direction along a first diagonal line, and each of the first unit pixel and the second unit pixel including a first tap including a first photo gate, the first tap configured to receive a first signal having a first phase difference with respect to the optical signal, and a second tap including a second photo gate, the second tap configured to receive a second signal having a second phase difference with respect to the optical signal, the second phase difference being different from the first phase difference, and a location of the first tap in the first unit pixel and a location of the first tap in the second unit pixel, and a location of the second tap in the first unit pixel and a location of the second tap in the second unit pixel, are point-symmetrical with each other based on a first point on the first diagonal line.

According to another aspect of at least one example embodiment of the inventive concepts, there is provided an image sensor including: a light source configured to output an optical signal onto an object, a pixel array comprising a plurality of unit pixels, the plurality of unit pixels including at least a first unit pixel and a second unit pixel, each of the plurality of unit pixels having a multi-tap structure, and each of the plurality of unit pixels configured to output a plurality of pixel signals corresponding to receiving a optical signal off of the object in response to the output optical signal, and a photo gate driver circuit unit comprising a plurality of photo gate drivers, the photo gate driver circuit configured to provide a plurality of signals having different phase differences from one another to the plurality of unit pixels, the first unit pixel and the second unit pixel are adjacent to each other, the first unit pixel and the second unit pixel each include a first tap including a first photo gate, the first tap configured to receive a first signal having a first phase difference with respect to the optical signal, a second tap including a second photo gate, the second tap configured to receive a second signal having a second phase difference with respect to the optical signal, the second phase difference being different from the first phase difference, and a location of the first tap in the first unit pixel and a location of the first tap in the second unit pixel, and a location of the second tap in the first unit pixel and a location of the second tap in the second unit pixel, are symmetrical with each other based on one point between the first unit pixel and the second unit pixel.

BRIEF DESCRIPTION OF THE DRAWINGS

Various example embodiments of the inventive concepts will be more clearly understood from the following detailed description taken in conjunction with the accompanying drawings in which.

DETAILED DESCRIPTION

Figure 1:
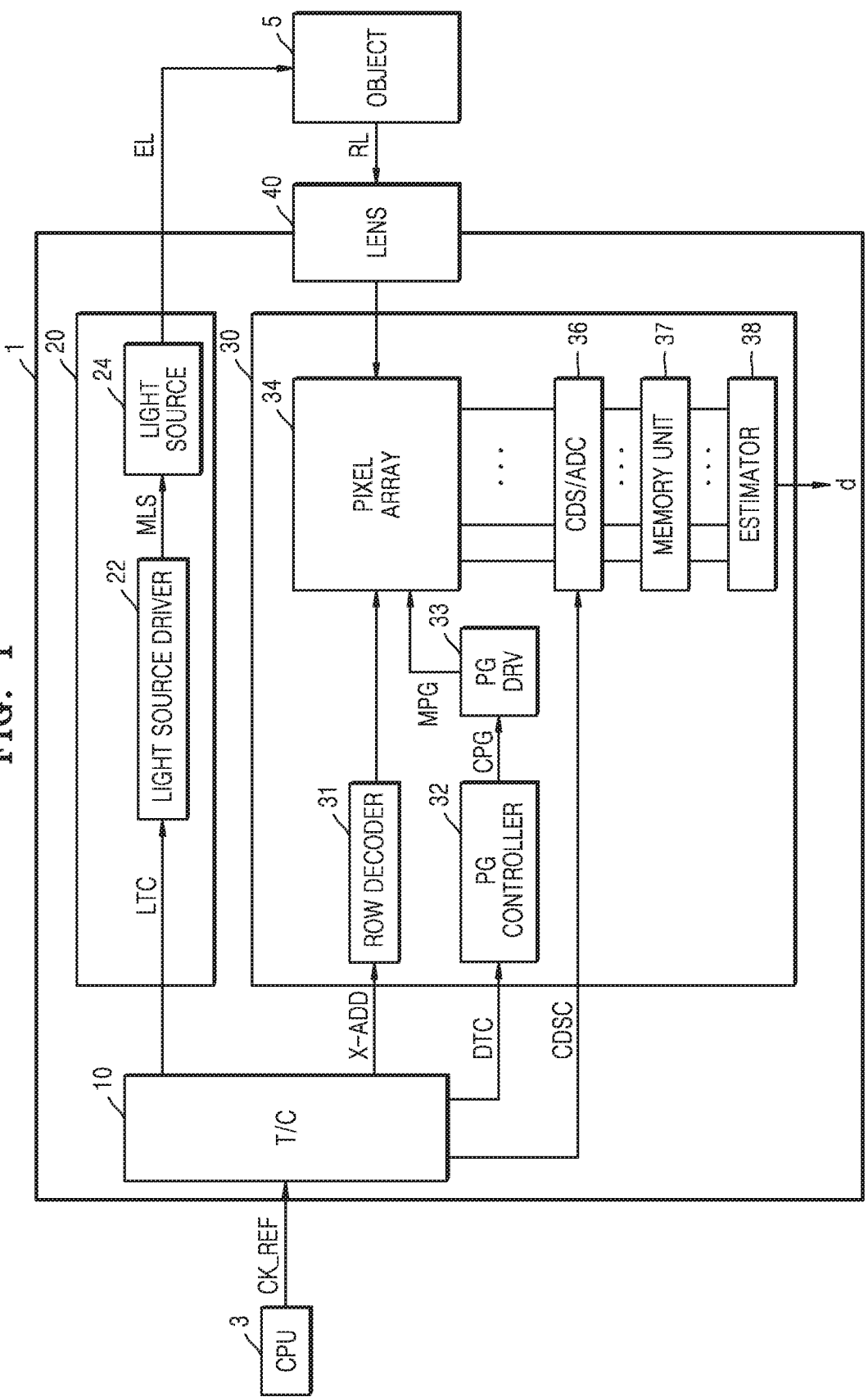
FIG. 1 is a block diagram of an image sensor according to at least one example embodiment.

Hereinafter, one or more example embodiments will be described in detail with reference to accompanying drawings. Like reference numerals denote the same elements on the drawings, and detailed descriptions thereof are omitted.

FIG. 1 is a block diagram of an image sensor 1 according to at least one example embodiment.

Referring to FIG. 1, the image sensor 1 may measure a distance and/or a depth by using a time of flight (ToF) method. The image sensor 1 may include a timing controller 10, an optical module 20, a distance sensor 30, and/or a lens module 40, but the example embodiments are not limited thereto.

The distance sensor 30 may include a row decoder 31, a photo gate controller 32, a photo gate driver circuit unit 33, a pixel array 34, a correlated double sampling (CDS)/analog-to-digital converting (ADC) circuit 36, a memory unit 37, and/or a distance estimator 38, etc., but the example embodiments are not limited thereto. In some example embodiments, the distance sensor 30 is implemented as a CMOS image sensor (CIS), but the example embodiments are not limited thereto and the distance sensor may be implemented using other means.

The timing controller 10 controls timing of operations of the optical module 20 and/or the distance sensor 30 based on a reference clock signal CK_REF transmitted from at least one central processing unit (CPU) 3. The CPU 3 generates the reference clock signal CK_REF by using a unit capable of generating a clock signal, e.g., a phase locked loop (PLL) circuit, an oscillator, etc., and may transmit the reference clock signal CK_REF to the image sensor 1.

A light radiation control signal LTC generated by the timing controller 10 is transferred to a light source driver 22 of the optical module 20, and a photo detection control signal DTC generated by the timing controller 10 may be transferred to the photo gate controller 32 of the distance sensor 30. Also, the timing controller 10 may transmit a row address signal X-ADD to the row decoder 31, and may transmit a CDS control signal CDSC to the CDS/ADC circuit 36.

The optical module 20 includes the light source driver 22 and/or a light source 24, etc., but is not limited thereto. The light source driver 22 may generate a clock signal MLS for driving the light source 24 based on the light radiation control signal LTC output from the timing controller 10. The light source 24 may radiate (e.g., emit, etc.) a modulated optical signal EL (e.g., a light emitted by the light source 24) onto an object 5, in response to the clock signal MLS generated by the light source driver 22. The light source 24 may be an infrared ray (IR) light source, a visible light source, an ultra-violet (UV) light source, etc., but the example embodiments are not limited thereto. The light source 24 may include a light-emitting diode (LED), an organic light-emitting diode (OLED), an active-matrix organic light-emitting diode (AMOLED), and/or a laser diode, etc. A form of the optical signal EL may be a sinusoidal wave or a square wave, but the example embodiments are not limited thereto.

A reflected optical signal RL reflected from the object 5 may be incident to the pixel array 34 of the distance sensor 30 via the lens module 40. Also, the light source driver 22 may provide the photo gate controller 32 with the clock signal MLS and/or information about the clock signal MLS.

The lens module 40 may include a lens and/or a band-pass filter, etc., but is not limited thereto. The band-pass filter may transmit IR, etc. Operations of the lens module 40 may be controlled by the timing controller 10.

The distance sensor 30 may demodulate the reflected optical signal RL reflected from the object 5, and then, output the demodulated reflected optical signal RL as an electric signal.

The pixel array 34 includes a plurality of unit pixels arranged as a matrix in rows and columns. As used herein, the term "row" denotes a set of a plurality of unit pixels arranged in a transverse direction from among the plurality of unit pixels included in the pixel array 34, and the term "column" denotes a set of a plurality of unit pixels arranged in a longitudinal direction from among the plurality of unit pixels included in the pixel array 34. The plurality of unit pixels may each configure a distance sensor.

The plurality of unit pixels included in the pixel array 34 may each have a multi-tap structure pixel including a plurality of taps. As used herein, the term "tap" denotes a component including a photo gate and a detection area for collecting and detecting photo charges according to a desired and/or predetermined demodulation signal.

In some example embodiments, the plurality of unit pixels included in the pixel array 34 of the distance sensor 30 may each be, for example, a 2-tap pixel, in which two sample outputs are provided from one unit pixel, however the example embodiments are not limited thereto. For example, in some other example embodiments, the plurality of unit pixels included in the pixel array 34 of the distance sensor 30 may each be a 4-tap pixel, in which four sample outputs are provided from one unit pixel, etc.

Each of the plurality of unit pixels may detect a phase difference between a phase of the reflected optical signal RL and a phase of the optical signal EL, in response to receiving a plurality of reflected optical signals RL that are incident to the pixel array 34 via the lens module 40. An image pixel signal may be output from phase difference information detected from the plurality of unit pixels.

The row decoder 31 may decode the row address signal X-ADD output from the timing controller 10 and may drive a certain row from among the plurality of rows of the plurality of unit pixels included in the pixel array 34 according to a decoding result. The row decoder 31 may output a plurality of control signals, e.g., a reset signal and/or a selection signal, etc., for driving a certain row from among the plurality of rows of the plurality of unit pixels.

The photo gate controller 32 may generate a plurality of photo gate control signals CPG based on the photo detection control signal DTC transmitted from the timing controller 10.

The photo gate driver circuit unit 33 is a circuit for driving the plurality of unit pixels included in the pixel array 34 of the distance sensor 30 in units of rows and/or in units of columns, by using (and/or based on) the plurality of photo gate control signals CPG output from the photo gate controller 32. The photo gate driver circuit unit 33 may include a plurality of buffer groups and/or a phase matching block, etc. The phase matching block generates a plurality of matching photo gate control signals MPG, phases of which match to one another (e.g., the phases of the plurality of matching photo gate control signals MPG corresponding to each other, etc.), by changing phases of the plurality of photo gate control signals CPG. For example, the plurality of matching photo gate control signals MPG may include a first photo gate signal Ga having a phase difference of 0° from the optical signal EL, a second photo gate signal Gb having a phase difference of 90° from the optical signal EL, a third photo gate signal Gc having a phase difference of 180° from the optical signal EL, and a fourth photo gate signal Gd having a phase difference of 270° from the optical signal EL. The first to fourth photo gate signals Ga, Gb, Gc, and Gd will be described in more detail below with reference to FIGS. 2A to 2C and FIGS. 10A to 10C.

The photo gate driver circuit unit 33 may apply the plurality of matching photo gate control signals MPG to each of the plurality of unit pixels included in the pixel array 34 via wirings, in units of rows and/or in units of columns. The plurality of matching photo gate control signals MPG may be applied to a plurality of photo gates in each of the plurality of unit pixels.

The plurality of unit pixels included in the pixel array 34 may receive the plurality of matching photo gate control signals MPG to generate pixel signals. The plurality of unit pixels included in the pixel array 34 may generate the pixel signals based on the plurality of matching photo gate control signals MPG that are regularly applied with constant phase differences and the reflected optical signal RL. The pixel array 34 may accumulate photocharges generated in response to the plurality of matching photo gate control signals MPG and the reflected optical signal RL for a desired and/or predetermined integration time period and may sequentially output results of accumulating the photocharges according to an order of finishing the photocharge accumulation operations.

At least two of the first to fourth photo gate signals Ga, Gb, Gc, and Gd may be simultaneously supplied to one unit pixel included in the pixel array 34, but the example embodiments are not limited thereto.

When the plurality of unit pixels included in the pixel array 34 of the distance sensor 30 are 2-tap pixels, two photo gate signals having different phase differences may be simultaneously supplied to one unit pixel included in the pixel array 34. For example, the first photo gate signal Ga and the third photo gate signal Gc, or the second photo gate signal Gb and the fourth photo gate signal Gd from among the plurality of matching photo gate control signals MPG generated by the photo gate controller 32 in one frame may be simultaneously supplied to one unit pixel included in the pixel array 34, etc. As used here, the term "frame" denotes a time period taken to finish photocharge accumulation, generation of pixel signals, and read-out operation once with respect to the whole pixel array 34, but the example embodiments are not limited thereto.

In some other example embodiments, the plurality of unit pixels included in the pixel array 34 of the distance sensor 30 may each be, e.g., a 4-tap pixel, etc. In the 4-tap pixel case, four photo gate signals having different phase differences, e.g., the first to fourth photo gate signals Ga, Gb, Gc, and Gd, from among the plurality of matching photo gate control signals MPG generated by the photo gate controller 32 in one frame may be supplied to one unit pixel included in the pixel array 34.

The CDS/ADC circuit 36 may output digital pixel signals by performing a CDS operation and an ADC operation on each image pixel signal output from each of the plurality of unit pixels in the pixel array 34, based on the CDS control signal CDSC output from the timing controller 10.

The memory unit 37 may store a plurality of pixel signals, e.g., A0, A1, A2, and A3, etc., output from the CDS/ADC circuit 36 in units of frames. The plurality of pixel signals A0, A1, A2, and A3 will be described in detail below with reference to FIGS. 2A and 2B and FIGS. 10A and 10B.

The distance estimator 38 calculates a phase difference between the optical signal EL and the reflected optical signal RL based on the plurality of pixel signals, e.g., A0, A1, A2, and A3 output from the memory unit 37, and may estimate a distance and/or a depth to the object 5 based on the calculated phase difference.

Figure 2A:
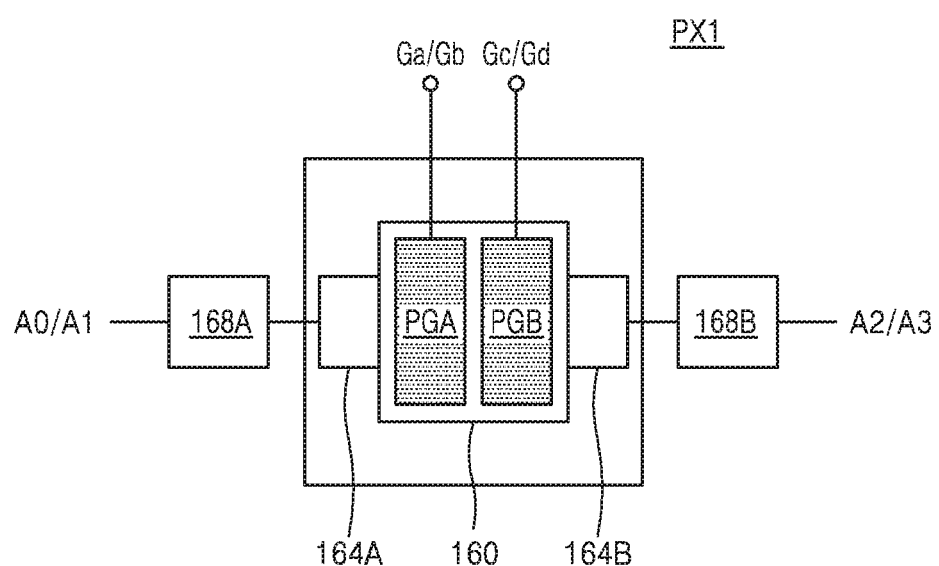
FIG. 2A is a layout for illustrating an example configuration of a unit pixel included in an image sensor according to at least one example embodiment.

FIG. 2A is a layout for illustrating an example of a unit pixel PX1 included in the image sensor 1 according to at least one example embodiment. The unit pixel PX1 shown in FIG. 2A may configure and/or may correspond to a unit pixel of the pixel array 34 included in the distance sensor 30 of the image sensor 1 of FIG. 1, but the example embodiments are not limited thereto.

Referring to FIG. 2A, the unit pixel PX1 may be a 2-tap pixel, but the example embodiments are not limited thereto.

The unit pixel PX1 may include a photoelectric conversion region 160, a first photo gate PGA and/or a second photo gate PGB, etc., arranged on the photoelectric conversion region 160, and two detection regions, that is, first and second detection regions 164A and 164B arranged on opposite sides of the photoelectric conversion region 160. The first and second detection regions 164A and 164B are arranged adjacent to the photoelectric conversion region 160 to receive electric signals from the photoelectric conversion region 160. The first detection region 164A may be arranged adjacent to the first photo gate PGA, and the second detection region 164B may be arranged adjacent to the second photo gate PGB. In addition, the unit pixel PX1 may further include a first circuit region 168A for transferring and/or amplifying photo electrons output from the first detection region 164A, and a second circuit region 168B for transferring and/or amplifying photo electrons output from the second detection region 164B. The first and second circuit regions 168A and 168B may each include a plurality of transistors.

In some example embodiments, the photoelectric conversion region 160 may be a photodiode, and may include an N-type impurity diffusion region on a P-type substrate, but the example embodiments are not limited thereto. The reflected optical signal RL (see FIG. 1) reflected from the object 5 is incident to the photoelectric conversion region 160 that generates the photocharges, in other words, when the photoelectric conversion region 160 receives the reflected optical signal RL, the photoelectric conversion region 160 generates the photocharges. For example, when a positive voltage is applied to the first photo gate PGA, holes having positive polarity are pushed towards the P-type substrate and electrons having negative polarity may be accumulated on a surface of the substrate under the first photo gate PGA in the photoelectric conversion region 160. Also, a potential gradation occurs due to a variation in an impurity concentration within the substrate and the applied positive voltage, and accordingly, the photo electrons accumulated on the surface of the substrate may be moved to the first detection region 164A. Similarly, when a positive voltage is applied to the second photo gate PGB, electrons are accumulated on the surface of the substrate under the second photo gate PGB in the photoelectric conversion region 160, and the photo electrons accumulated on the surface of the substrate may be moved to the second detection region 164B.

Figure 2B:
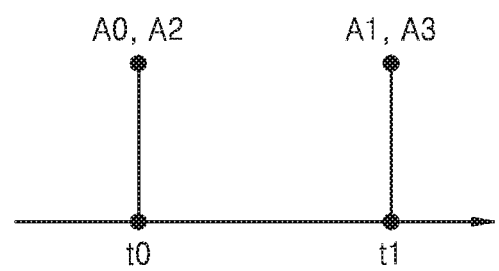
FIG. 2B is a diagram for illustrating an example operation of a unit pixel included in an image sensor according to at least one example embodiment.
Figure 2C:
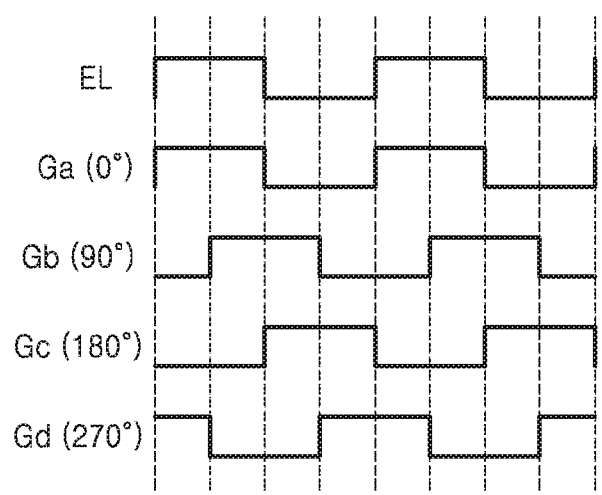
FIG. 2C is a graph showing a phase difference between photo-gate signals applied to a unit pixel included in an image sensor according to at least one example embodiment and an optical signal.

FIG. 2B is a diagram for illustrating an example operation of the unit pixel PX1 of FIG. 2A according to at least one example embodiment. FIG. 2C is a graph showing phase differences between the first to fourth photo gate signals Ga, Gb, Gc, and Gd applied to the unit pixel PX1 of FIG. 2A and the optical signal EL according to at least one example embodiment.

Referring to FIGS. 2A to 2C, two photo gate signals having a phase difference of 180°, for example, the first and third gate signals Ga and Gc, are applied to the first and second photo gates PGA and PGB at a time point t0. Next, the photo electrons are output to the first and second detection regions 164A and 164B in response to the first and third photo gate signals Ga and Gc, and the photo electrons output from the first and second detection regions 164A and 164B may be output as two pixel signals, that is, the first and third pixel signals A0 and A2, via the first and second circuit regions 168A and 168B.

Other two photo gate signals having a phase difference of 180°, for example, the second and fourth photo gate signals Gb and Gd, are applied to the first and second photo gates PGA and PGB at a second time point t1. The corresponding photo electrons are then output to the first and second detection regions 164A and 164B in response to the second and fourth photo gate signals Gb and Gd, and the photo electrons output from the first and second detection regions 164A and 164B may be output two other pixel signals, that is, the second and fourth pixel signals A1 and A3, via the first and second circuit regions 168A and 168B.

In the unit pixel PX1 including the 2-tap pixel, the first to fourth photo gate signals Ga, Gb, Gc, and Gd having the phase difference of 90° among one another may be regularly applied to the first and second photo gates PGA and PGB by two of them, in the above-described manner, but the example embodiments are not limited thereto and the unit pixel may have an N-tap pixel, N being a natural number. In the unit pixel PX1, the photo electrons generated from the reflected optical signal RL (see FIG. 1) are accumulated for a desired and/or predetermined time period, and a sampling operation is performed twice sequentially on the unit pixel PX1. Then, the first to fourth pixel signals A0, A1, A2, and A3 respectively corresponding to the first photo gate signal Ga having a phase difference, for example, of 0° from the optical signal EL, the second photo gate signal Gb having a phase difference, for example, of 90° from the optical signal EL, the third photo gate signal Gc having a phase difference, for example, of 180° from the optical signal EL, and the fourth photo gate signal Gd having a phase difference, for example, of 270° from the optical signal EL, may be generated, however the example embodiments are not limited thereto.

Figure 2D:
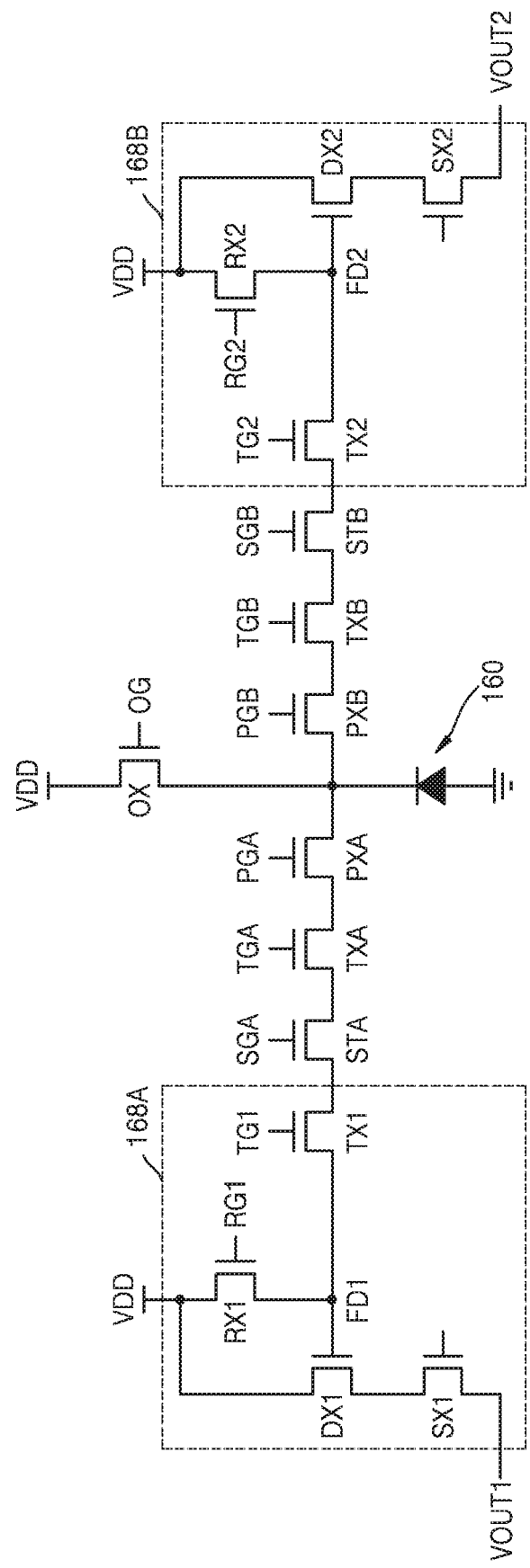
FIG. 2D is a circuit diagram of an example of a unit pixel included in an image sensor according to at least one example embodiment.

FIG. 2D is an example circuit diagram of the unit pixel PX1 of FIG. 2A according to at least one example embodiment.

Referring to FIG. 2D, the unit pixel PX1 includes a plurality of photoelectric conversion devices, such as a first photoelectric conversion device PXA and a second photoelectric conversion device PXB, etc., connected to the photoelectric conversion region 160.

The photoelectric conversion region 160 may sense light (and/or receive light, etc.). The photoelectric conversion region 160 may generate an electron-hole pair (EHP) based on the sensed light/received light. A depletion region may be generated according to a voltage of a signal applied to the first photo gate PGA of the first photoelectric conversion device PXA. The electron and hole in the EHP are isolated due to the depletion region, and the electron may be accumulated under the first photoelectric conversion device PXA. Similar to the description related to the first photoelectric conversion device PXA, electrons may be accumulated under the second photoelectric conversion device PXB according to a voltage of a signal applied to the second photo gate PGB of the second photoelectric conversion device PXB. The signal applied to the first photo gate PGA and the signal applied to the second photo gate PGB may have a phase difference of 180°□□but the example embodiments are not limited thereto.

The unit pixel PX1 may include a plurality of first transistors, such as a first shutter transistor TXA connected to the first photoelectric conversion device PXA, a first storage transistor STA, a first transfer transistor TX1, a first drive transistor DX1, a first selection transistor SX1, and/or a first reset transistor RX1, etc., but is not limited thereto. Also, the unit pixel PX1 may include a plurality of second transistors, such as a second shutter transistor TXB connected to the second photoelectric conversion device PXB, a second storage transistor STB, a second transfer transistor TX2, a second drive transistor DX2, a second selection transistor SX2, and/or a second reset transistor RX2, etc., but is not limited thereto.

The first and second shutter transistors TXA and TXB may selectively turn on/off transmission of the photocharges that are transferred from the photoelectric conversion region 160 to the first and second storage transistors STA and STB in response to signals applied to first and second shutter gates TGA and TGB.

The first and second storage transistors STA and STB may store the photocharges transferred through the first and second shutter transistors TXA and TXB in response to storage control signals respectively applied to first and second storage gates SGA and SGB.

The first and second transfer transistors TX1 and TX2 may transfer the photocharges stored in storage areas of the first and second storage transistors STA and STB to first and second floating diffusion regions FD1 and FD2, in response to transfer control signals applied to first and second transfer gates TG1 and TG2. The first and second transfer transistors TX1 and TX2 may turn on/off an electrical connection between the first storage transistor STA and the first floating diffusion region FD1 and an electrical connection between the second storage transistor STB and the second floating diffusion region FD2, according to the transfer control signals applied to the first and second transfer gates TG1 and TG2.

The drive transistors, e.g., the first and second drive transistors DX1 and DX2, function as source follower buffer amplifiers, and may perform a buffering operation in response to the photocharges charged in the first and second floating diffusion regions FD1 and FD2, and amplify voltages of the first and second floating diffusion regions FD1 and FD2. For example, the first drive transistor DX1 includes a gate connected to the first floating diffusion region FD1, a drain to which a power voltage VDD is connected, and a source connected to the first selection transistor SX1. A voltage at the source of the first drive transistor DX1 may be determined according to the voltage of the first floating diffusion region FD1. The voltage of the first floating diffusion region FD1 may be determined according to an amount of electrons transferred from the first photoelectric conversion device PXA. The second drive transistor DX2 may have a similar structure to that of the first drive transistor DX1, but is not limited thereto.

The plurality of reset transistors, such as the first and second reset transistors RX1 and RX2, detect pixel information based on the voltages of the first and second floating diffusion regions FD1 and FD2, and after that, discharge the charges accumulated in the first and second floating diffusion regions FD1 and FD2 when reset signals applied to the first and second reset gates RG1 and RG2 are activated, in order to initialize the first and second floating diffusion regions FD1 and FD2 to a power voltage VDD level. For example, the first reset transistor RX1 may include the first reset gate RG1 to which the reset signal is applied, a drain connected to the power voltage VDD, and a source connected to the first floating diffusion region FD1. The second reset transistor RX2 may have a similar structure to that of the first reset transistor RX1, but is not limited thereto.

The plurality of selection transistors, such as the first and second selection transistors SX1 and SX2, may output image pixel signals output from the first and second drive transistors DX1 and DX2 to a column line. For example, the first selection transistor SX1 may include a gate to which a selection signal is applied, a drain connected to the source of the first drive transistor DX1, and a source connected to a bit line of the pixel array 34 (see FIG. 1). The second selection transistor SX2 may have a similar structure to that of the first selection transistor SX1, but is not limited thereto. The first and second selection transistors SX1 and SX2 may output the voltages amplified by the first and second drive transistors DX1 and DX2 as first and second output voltages VOUT1 and VOUT2, in response to the selection signals applied to the gates thereof.

The first transfer transistor TX1, the first drive transistor DX1, the first selection transistor SX1, the first reset transistor RX1, and the first floating diffusion region FD1 may configure (e.g., may be included in) the first circuit region 168A. The second transfer transistor TX2, the second drive transistor DX2, the second selection transistor SX2, the second reset transistor RX2, and the second floating diffusion region FD2 may configure (e.g., may be included in) the second circuit region 168B.

An overflow transistor OX may be connected between the photoelectric conversion region 160 and a power voltage VDD terminal. The overflow transistor OX may be used to decrease and/or prevent the photocharges generated in the photoelectric conversion region 160 from overflowing to the storage areas of the first and second storage transistors STA and STB. The overflow transistor OX may be turned on or off according to an overflow gate signal applied to an overflow gate OG. When a drive gating signal is applied to the overflow gate OG, surplus photocharges generated during a time rather than a desired unit time period set in advance may be emitted from the photoelectric conversion region 160.

The circuit configuration of the unit pixel PX1 shown in FIG. 2D is an example and may be modified variously within the scope of the inventive concepts. For example, at least one of the first and second shutter transistors TXA and TXB, the first and second storage transistors STA and STB, the first and second transfer transistors TX1 and TX2, and the overflow transistor OX may be omitted.

Figure 3:
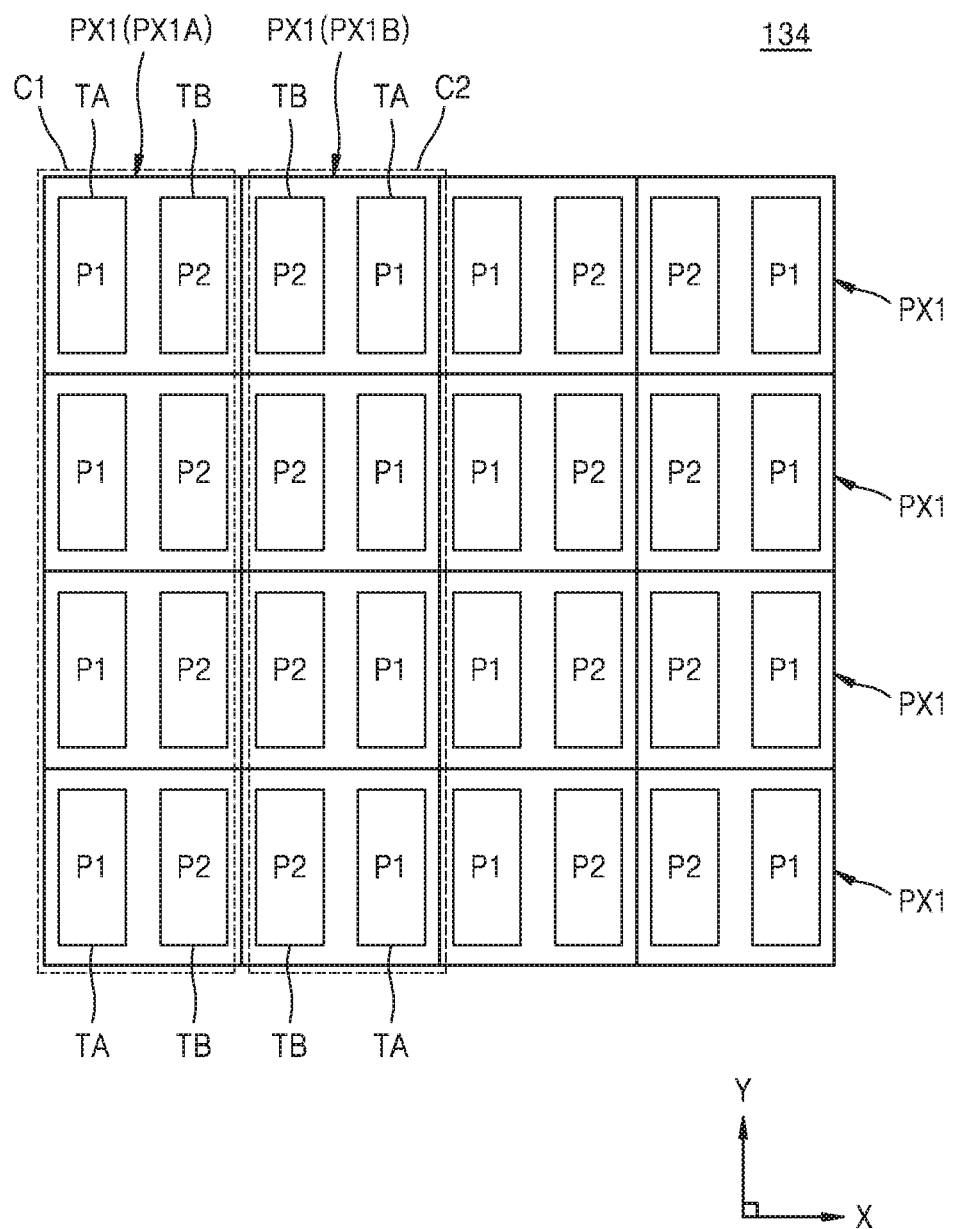
FIG. 3 is a layout for illustrating an example configuration of a pixel array included in an image sensor according to at least one example embodiment.

FIG. 3 is a layout for illustrating an example configuration of a pixel array 134 included in the image sensor 1 according to at least one example embodiment. The pixel array 134 shown in FIG. 3 may have the same or similar configuration as the pixel array 34 included in the distance sensor 30 of the image sensor 1 of FIG. 1, but the example embodiments are not limited thereto.

Referring to FIGS. 2A and 3, the pixel array 134 may include a plurality of unit pixels PX1 arranged as a matrix in a row line direction (X direction) and a column line direction (Y direction). The plurality of unit pixels PX1 may each include, for example, a first tap TA including the first photo gate PGA and the first detection region 164A, and a second tap TB including the second photo gate PGB and the second detection region 164B, but the example embodiments are not limited thereto. In FIG. 3, first and second signals P1 and P2 respectively applied to the first and second photo gates PGA and PGB of the first and second taps TA and TB are represented in the first and second taps TA and TB in each of the plurality of unit pixels PX1, but the example embodiments are not limited thereto.

The pixel array 134 may be configured so that the first and second signals P1 and P2 having different phase differences may be applied to the first and second photo gates PGA and PGB included in the first and second taps TA and TB in each of the plurality of unit pixels PX1, however the example embodiments are not limited thereto. The first signal P1 and the second signal P2 may be respectively selected from among a signal having, for example, a phase difference of 0° from the optical signal EL (hereinafter, referred to as "0° signal"), a signal having a phase difference of 90° from the optical signal EL (hereinafter, referred to as "90° signal"), a signal having a phase difference of 180° from the optical signal EL (hereinafter, referred to as "180° signal"), and a signal having a phase difference of 270° from the optical signal EL (hereinafter, referred to as "270° signal"), etc., and may be different signals having a phase difference of, for example, 180° from each other. In at least one example embodiment, the first signal P1 may be a 0° signal and the second signal P2 may be an 180° signal. In at least one other example embodiment, the first signal P1 may be a 90° signal and the second signal P2 may be a 270° signal.

In two neighboring unit pixels PX1 in the row line direction from among the plurality of unit pixels PX1, for example, a first unit pixel PX1A and a second unit pixel PX1B shown in an upper left portion of FIG. 3, locations of the first and second taps TA and TB may be axially symmetric with each other about one straight line extending from between the first and second unit pixels PX1A and PX1B in the Y direction, but the example embodiments are not limited thereto.

In the plurality of unit pixels PX1 arranged in the column line direction in one column, e.g., a first column C1, from among the plurality of unit pixels PX1, the locations of the taps, e.g., the first and second taps TA and TB, to which the signals, e.g., the first and second signals P1 and P2, are applied may be the same as one another, but not limited thereto. Also, in the plurality of unit pixels PX1 arranged in the column line direction in two neighboring columns, e.g., the first column C1 and a second column C2, from among the plurality of unit pixels PX1, the taps, e.g., the first and second taps TA and TB to which the signals, e.g., the first and second signals P1 and P2, are to be applied may be symmetrical with each other in units of columns, but are not limited thereto. For example, the locations of the first and second taps TA and TB in the unit pixel PX1 of the first column C1 and the locations of the first and second taps TA and TB in the unit pixel PX1 of the second column C2 may be symmetrical with each other.

Figure 4A:
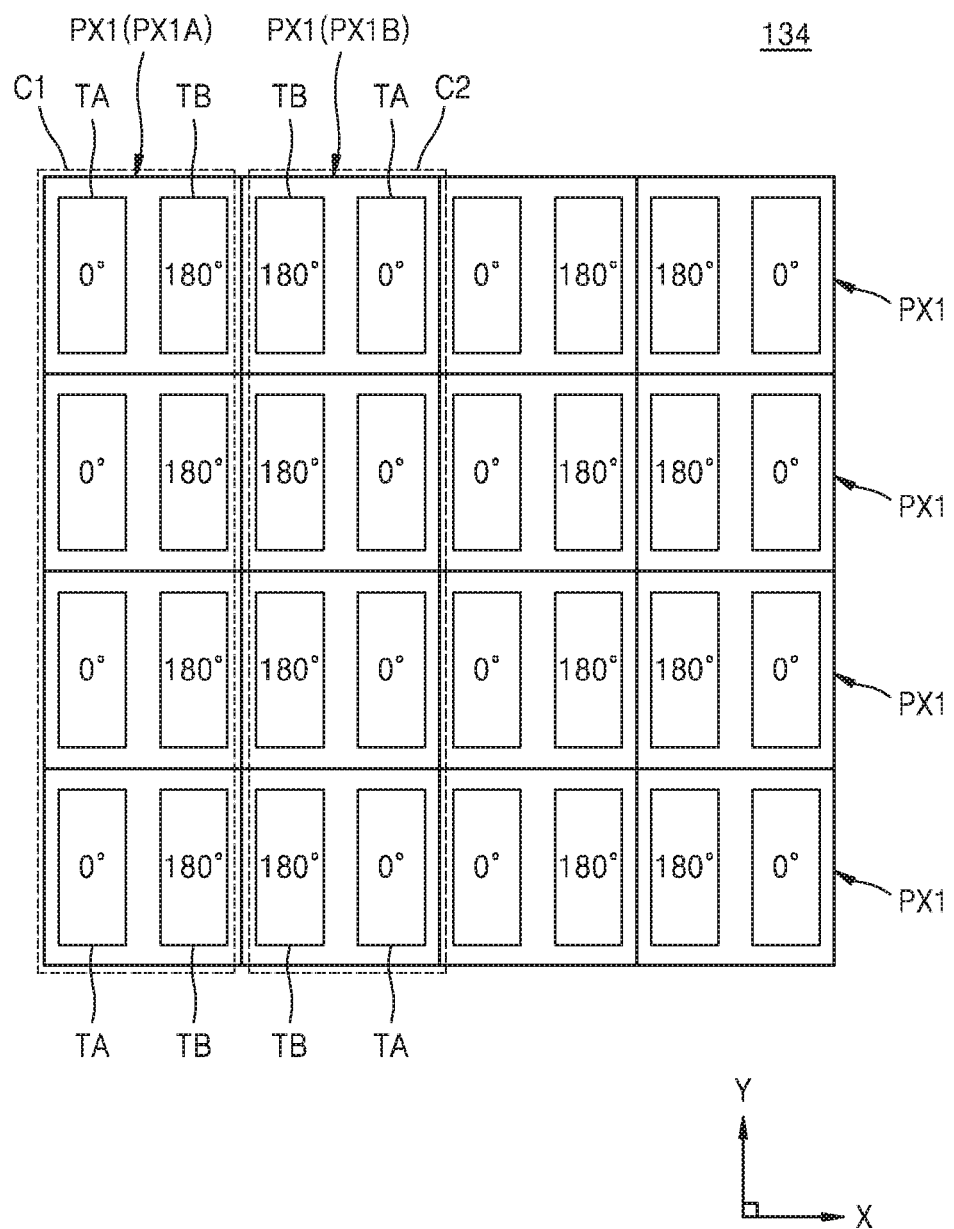
FIGS. 4A and 4B are plan views for illustrating example signals applied to a plurality of unit pixels in the pixel array of FIG. 3 according to at least one example embodiment.
Figure 4B:
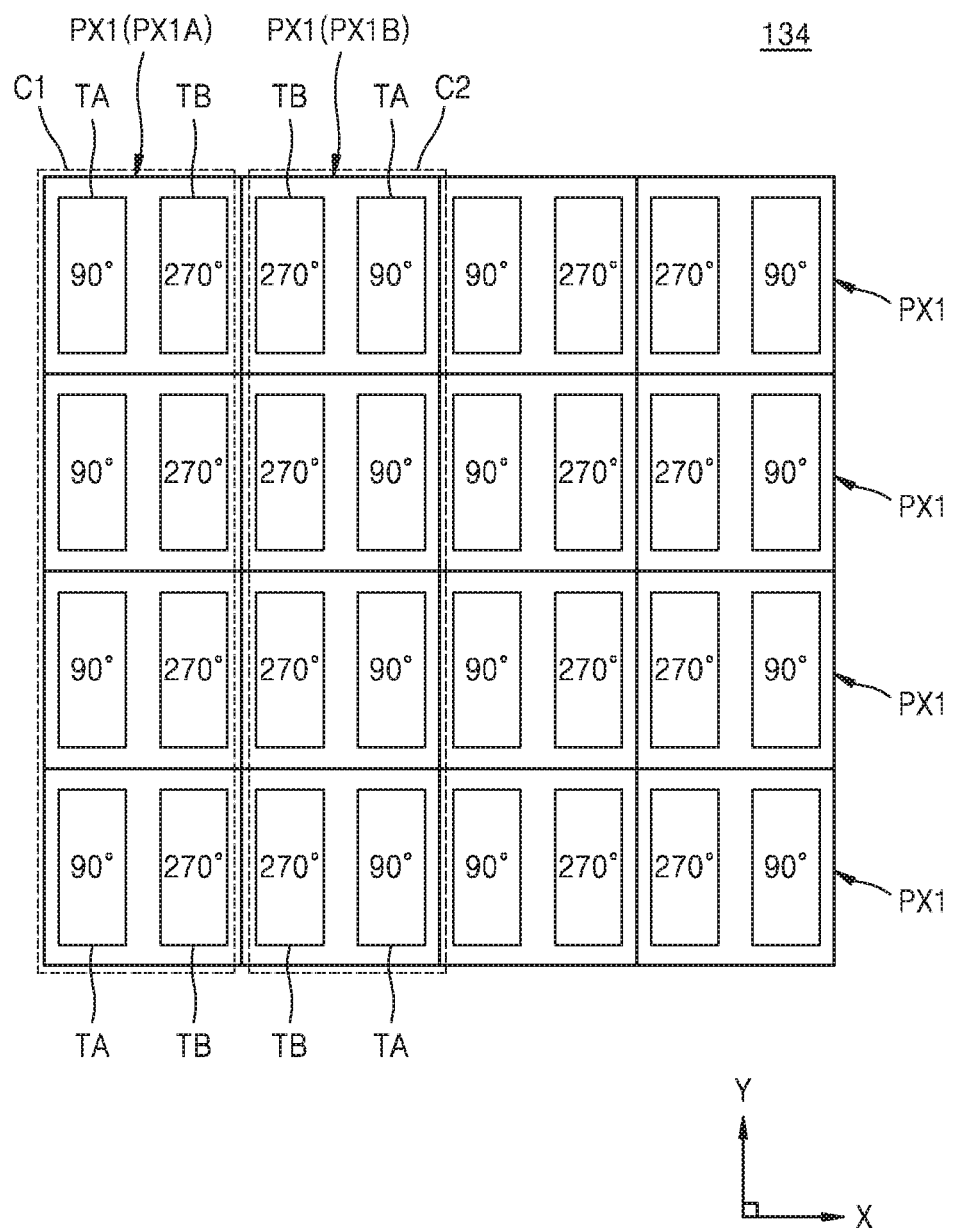

FIGS. 4A and 4B are plan views for illustrating example signals applied to the first and second taps TA and TB in each of the plurality of unit pixels PX1 included in the pixel array 134 of FIG. 3 according to at least one example embodiment.

Referring to FIGS. 2A, 3, and 4A, the first photo gate PGA of the first tap TA in one of the plurality of unit pixels PX1 in the first column C1, for example, the first unit pixel PX1A, and the first photo gate PGA of the first tap TA in one of the plurality of unit pixels PX1 in the second column C2, for example, the second unit pixel PX1B, may each be configured to receive, for example, a 0° signal as the first signal P1. Also, the second photo gate PGB of the second tap TB in one of the plurality of unit pixels PX1 in the first column C1, for example, the first unit pixel PX1A, and the second photo gate PGB of the second tap TB in one of the plurality of unit pixels PX1 in the second column C2, for example, the second unit pixel PX1B, may each be configured to receive, for example, a 180° signal as the second signal P2. However, the one or more example embodiments are not limited to the example of FIG. 4A. For example, in the plurality of unit pixels PX1 in the first column C1 and the second column C2, the first photo gate PGA of the first tap TA may be configured to receive an 180° signal and the second photo gate PGB of the second tap TB may be configured to receive a 0° signal, etc.

Referring to FIGS. 2A, 3, and 4B, the first photo gate PGA of the first tap TA in one of the plurality of unit pixels PX1 in the first column C1, for example, the first unit pixel PX1A, and the first photo gate PGA of the first tap TA in one of the plurality of unit pixels PX1 in the second column C2, for example, the second unit pixel PX1B, may each be configured to receive, for example, a 90° signal as the first signal P1. Also, the second photo gate PGB of the second tap TB in one of the plurality of unit pixels PX1 in the first column C1, for example, the first unit pixel PX1A, and the second photo gate PGB of the second tap TB in one of the plurality of unit pixels PX1 in the second column C2, for example, the second unit pixel PX1B, may each be configured to receive, for example, a 270° signal as the second signal P2. However, the one or more example embodiments are not limited to the example of FIG. 4B. For example, in the plurality of unit pixels PX1 in the first column C1 and the second column C2, the first photo gate PGA of the first tap TA may be configured to receive a 270° signal and the second photo gate PGB of the second tap TB may be configured to receive a 90° signal, etc.

Figure 5:
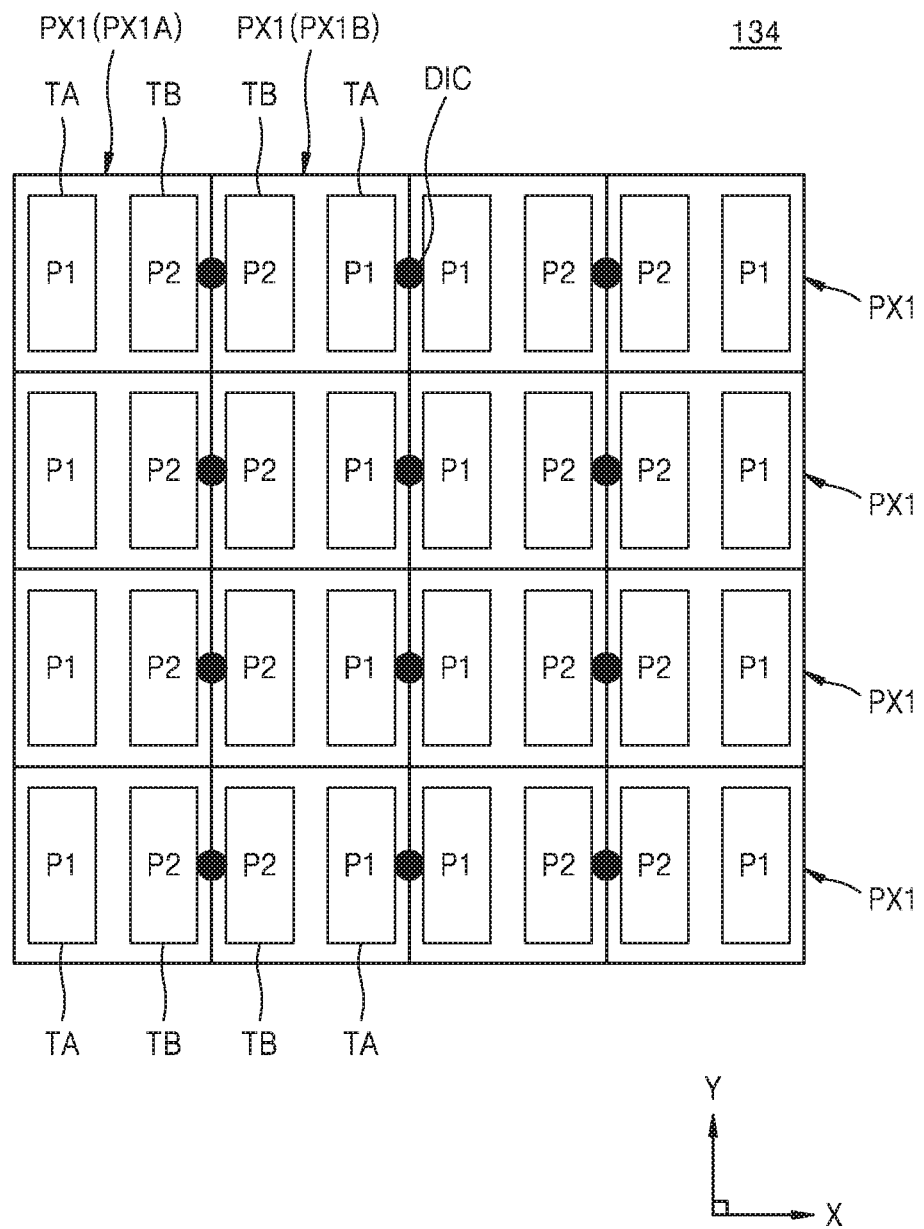
FIG. 5 is a diagram for illustrating an example of tap information in the pixel array of FIG. 3 according to at least one example embodiment.

FIG. 5 is a diagram illustrating tap information according to an example for calculating distance information of the object 5 (see FIG. 1) in the pixel array 134 of FIG. 3 according to at least one example embodiment. In FIG. 5, a plurality of points indicated as DIC may each denote a center point of distance information of the object 5.

Referring to FIG. 5, in order to obtain distance information about and/or corresponding to one distance information center DIC, information obtained from the taps of one or more unit pixels, e.g., the first and second taps TA and TB of two unit pixels PX1, the first and second taps TA and TB of which are symmetrical with each other, for example, the first unit pixel PX1A and the second unit pixel PX1B, may be used (e.g., the time of flight distance information associated with the DIC may be obtained using the taps of the plurality of unit pixels, etc.).

For example, in the pixel array 134 described with reference to FIGS. 3, 4A, 4B, and 5, the first and second taps TA and TB of the plurality of unit pixels PX1 are arranged to be symmetrical with each other in two neighboring unit pixels PX1, and thus, each unit pixel PX1 may receive light through a different location from the others with respect to one phase difference signal. Therefore, with respect to one phase difference signal, an average of two pixel signals regarding two different directions may be obtained based on this example configuration, but the example embodiments are not limited thereto.

The taps receiving the same signal in each unit pixel PX1 may have a difference in sensitivities and/or other characteristics of the taps, and/or tap asymmetry may occur between the taps receiving the same signal in each unit pixel PX1, due to various factors such as process distribution during manufacturing of the image sensor 1, misalignment among elements of the image sensor 1, light shading when the image sensor 1 operates, a size of a chief ray angle (CRA), etc. According to at least one example embodiment, the first and second taps TA and TB in each of the plurality of unit pixels PX1 are arranged to be symmetrical with those of a neighboring unit pixel PX1, and distance information from one point between two neighboring unit pixels PX1 is obtained by using tap information of the two neighboring unit pixels PX1. Thus, errors caused due to the asymmetry among the taps may be decreased, compensated for, and/or offset, and accordingly, accuracy in the distance information may be improved.

Figure 6:
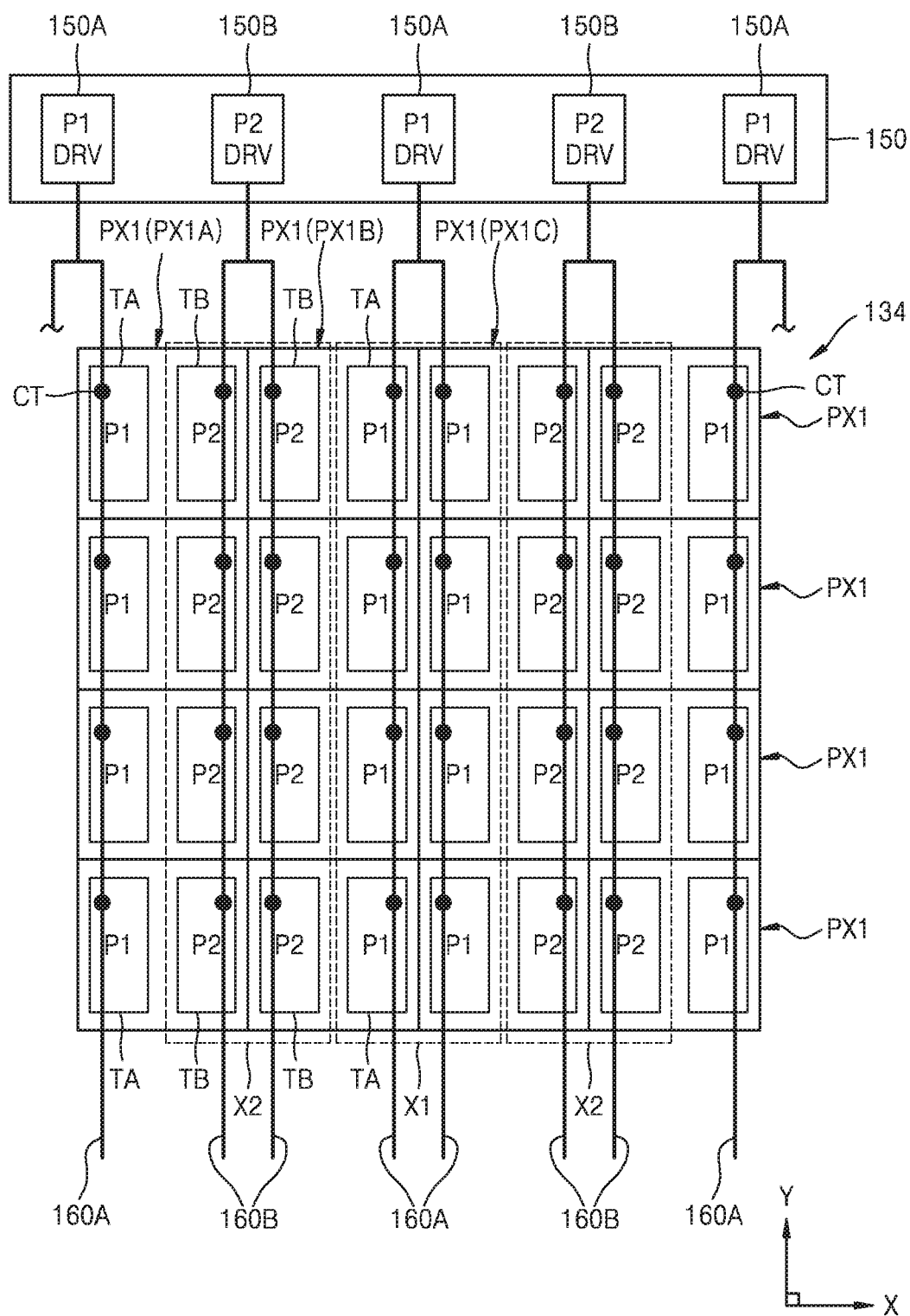
FIG. 6 is a diagram for illustrating an example of a connecting relation between a pixel array and a photo-gate driver circuit unit in an image sensor according to at least one example embodiment.

FIG. 6 is a diagram illustrating an example of a connecting relation between the pixel array 134 and a photo gate driver circuit unit 150 used to drive the pixel array 134, in a case where the image sensor according to at least one example embodiment includes the pixel array 134 of FIG. 3, however the example embodiments are not limited thereto.

Referring to FIGS. 2A and 6, the photo gate driver circuit unit 150 may configure and/or correspond to the photo gate driver circuit unit 33 of the image sensor 1 shown in FIG. 1, but the example embodiments are not limited thereto. The photo gate driver circuit unit 150 may be connected to the pixel array 134 via a plurality of wirings including first and second wirings 160A and 160B, etc.

The photo gate driver circuit unit 150 may include a first photo gate driver 150A for applying the first signal P1 to the first photo gate PGA and a second photo gate driver 150B for applying the second signal P2 to the second photo gate PGB, but is not limited thereto. For example, the first wiring 160A may be connected between the first photo gate driver 150A and a plurality of first photo gates PGA, and the second wiring 160B may be connected between the second photo gate driver 150B and a plurality of second photo gates PGB. The photo gate driver circuit unit 150 may be configured to transfer the first and second signals P1 and P2 to the first and second photo gates PGA and PGB of the first and second taps TA and TB included in each of the plurality of unit pixels PX1 that are included in the pixel array 134, via the first wiring 160A and the second wiring 160B.

In the pixel array 134, two neighboring unit pixels PX1, the first and second taps TA and TB of which are symmetrical with each other, may be connected to the first photo gate driver 150A or the second photo gate driver 150B via one wiring selected between the first wiring 160A and the second wiring 160B.

According to at least one example embodiment, among the plurality of unit pixels PX1, the first unit pixel PX1A and the second unit pixel PX1B are next to each other and have the first and second taps TA and TB that are symmetrical with each other, and the second unit pixel PX1B and a third unit pixel PX1C are next to each other and have the first and second taps TA and TB that are symmetrically arranged with respect to each other, but the example embodiments are not limited thereto.

The first photo gate PGA included in the second unit pixel PX1B and the first photo gate PGA included in the third unit pixel PX1C may each be connected to the first photo gate driver 150A via the first wiring 160A that is selected from among the first and second wirings 160A and 160B.

Among the plurality of unit pixels PX1, a plurality of first photo gates PGA included in the unit pixels PX1 of a first row arranged in the row line direction and a plurality of first photo gates PGA included in the unit pixels PX1 of a second row next to the first row are connected to one first wiring 160A, for example via contacts CT, and are connected together with the first photo gate driver 150A via the first wiring 160A to simultaneously receive the same phase difference signal from the first photo gate driver 150A. Therefore, as in a region denoted by a dashed line X1 in FIG. 6, the unit pixels PX1 of two rows extending in two neighboring row lines may share one first photo gate driver 150A.

In addition, the second photo gate PGB included in the first unit pixel PX1A and the second photo gate PGB included in the second unit pixel PX1B may each be connected to the second photo gate driver 150B via the second wiring 160B that is selected from among the first and second wirings 160A and 160B. Among the plurality of unit pixels PX1, a plurality of second photo gates PGB included in the unit pixels PX1 of the first row arranged in the row line direction and a plurality of second photo gates PGB included in the unit pixels PX1 of the second row next to the first row are connected to one second wiring 160B, for example, via contacts CT, etc., and are connected together with the second photo gate driver 150B via the second wiring 160B to simultaneously receive the same phase difference signal from the second photo gate driver 150B, but the example embodiments are not limited thereto. Therefore, as in a region denoted by a dashed line X2 in FIG. 6, the unit pixels PX1 of two rows extending in two neighboring row lines may share one second photo gate driver 150B.

In the image sensor including the pixel array 134 and the photo gate driver circuit unit 150 having the above example of a connecting relation as shown in FIG. 6, since the unit pixels PX1 in a plurality of rows share one first photo gate driver 150A and one second photo gate driver 150B, the number of photo gate drivers in the photo gate driver circuit unit 150 may be reduced in comparison to conventional image sensors, and a circuit structure and wiring structure of the image sensor may be simplified, thereby improving and/or increasing yields during semiconductor fabrication of the image sensors over conventional image sensors and/or reducing the size and cost of the image sensors.

Figure 7:
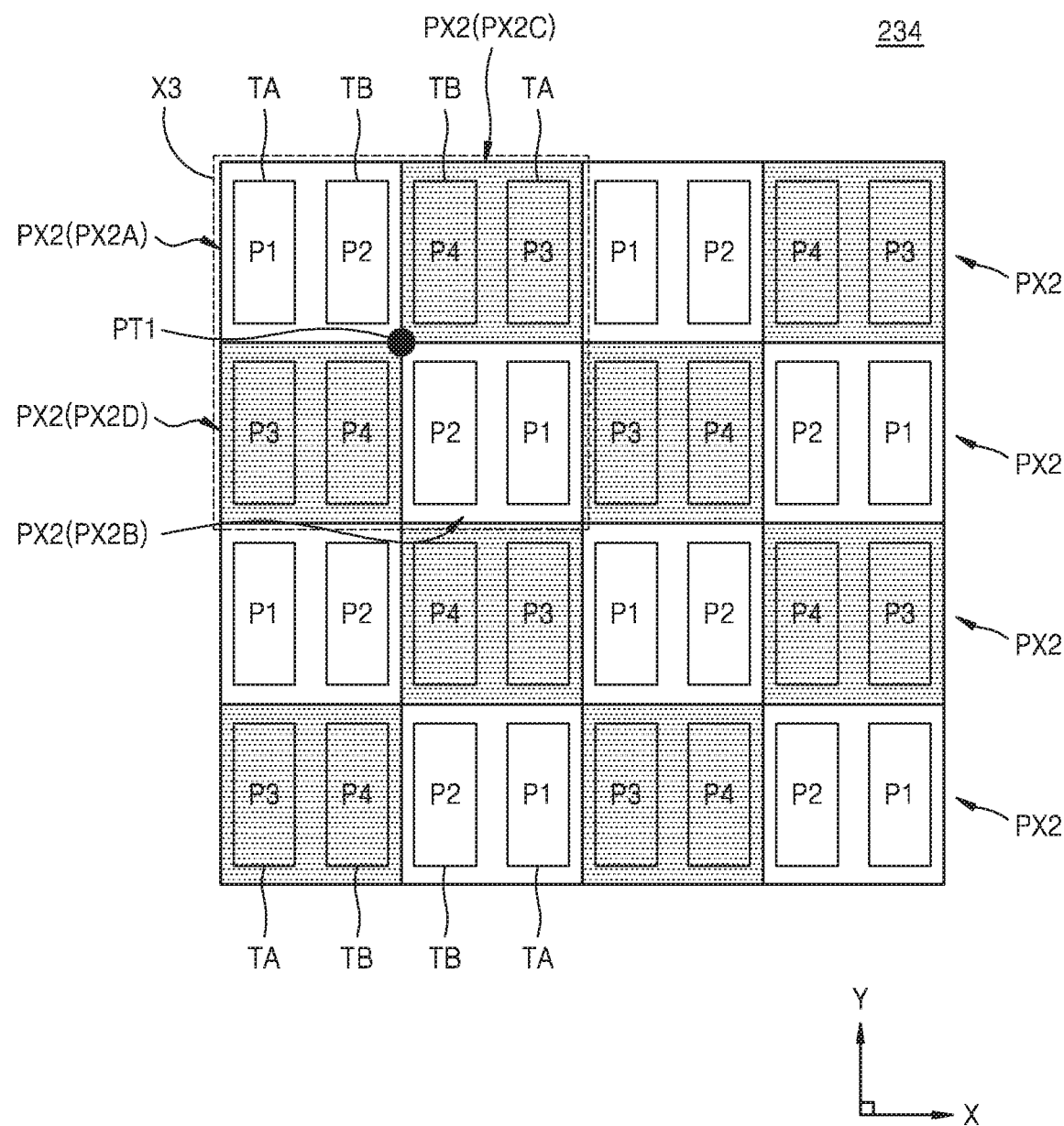
FIG. 7 is a layout for illustrating an example configuration of a pixel array included in an image sensor according to at least one example embodiment.

FIG. 7 is a layout for illustrating another example configuration of a pixel array 234 included in the image sensor 1 according to at least one example embodiment. The pixel array 234 shown in FIG. 7 may configure and/or correspond to the pixel array 34 included in the distance sensor 30 of the image sensor 1 of FIG. 1, but the example embodiments are not limited thereto.

FIG. 7 shows a part of the pixel array 234 including a plurality of unit pixels PX2 arranged as a matrix in a row line direction (X direction) and a column line direction (Y direction).

Referring to FIG. 7, the pixel array 234 may have a structure similar to that of the pixel array 134 shown in FIG. 3, but the example embodiments are not limited thereto. The plurality of unit pixels PX2 may each have a 2-tap pixel structure like the unit pixel PX1 described above with reference to FIG. 2A, but are not limited thereto and may have other tap pixel structures. The plurality of unit pixels PX2 may each include a circuit configuration described above with reference to FIG. 2D, but the example embodiments are not limited thereto. However, the first and second signals P1 and P2 having different phase differences may be applied to some of the plurality of unit pixels PX2 in the pixel array 234, and third and fourth signals P3 and P4 having different phase differences from each other may be applied to some other unit pixels PX2. In some example embodiments, the first signal P1 and the second signal P2 are respectively selected from, for example, the 0° signal and the 180° signal, and the third signal P3 and the fourth signal P4 may be respectively selected from, for example, the 90° signal and the 270° signal, but are not limited thereto. In some example embodiments, the first signal P1 and the second signal P2 are respectively selected from the 90° signal and the 270° signal, and the third signal P3 and the fourth signal P4 may be respectively selected from the 0° signal and the 180° signal, etc.

The pixel array 234 may include, for example, first to fourth unit pixels PX2A, PX2B, PX2C, and PX2D, in a 2×2 pixel array configuration as in a region indicated by a dashed line X3, but the example embodiments are not limited thereto and the pixel array may have other configurations, e.g., 3×3, 4×4, 2×4, etc. In the 2×2 pixel array in the region indicated by the dashed line X3, two neighboring unit pixels PX2 in a direction along a diagonal line may be point-symmetrical with each other based on one point on the diagonal line, but the example embodiments are not limited thereto.

For example, the first and second taps TA and TB in the first unit pixel PX2A and the first and second taps TA and TB in the second unit pixel PX2B, wherein the first and second unit pixels PX2A and PX2B are adjacent to each other in the direction along the diagonal line, may be point-symmetrical with each other based on a first point PT1 on the diagonal line. Also, the first and second taps TA and TB in the third unit pixel PX2C and the first and second taps TA and TB in the fourth unit pixel PX2D, wherein the third and fourth unit pixels PX2C and PX2D are adjacent to each other in another direction along another diagonal line, may be point-symmetrical with each other based on a first point PT1 on the another diagonal line.

In some example embodiments, while the first signal P1 and the second signal P2 are applied to the first and second photo gates PGA and PGB in each of the first and second unit pixels PX2A and PX2B, the third signal P3 and the fourth signal P4 may be applied to the first and second photo gates PGA and PGB in each of the third unit pixel PX2C and the fourth unit pixel PX2D, but the example embodiments are not limited thereto.

In the example of FIG. 7, the first taps TA to which the first signal P1 is applied in the first and second unit pixels PX2A and PX2B are farther from the first point PT1 than the second taps TB to which the second signal P2 is applied, and the first taps TA to which the third signal P3 is applied in the third and fourth unit pixels PX2C and PX2D are farther from the first point PT1 than the second taps TB to which the fourth signal P4 is applied. However, the first tap TA may be arranged closer to the first tap TA than the second tap TB in each of the first and second unit pixels PX2A and PX2B, and the first tap TA may be arranged closer to the first point PT1 than the second tap TB in each of the third and fourth unit pixels PX2C and PX2D, etc.

In the pixel array 234, the configuration of the first to fourth unit pixels PX2A, PX2B, PX2C, and PX2D in the 2×2 pixel array configuration may be repeatedly arranged a plurality of times in the row line direction and the column line direction of the pixel array 234, however the example embodiments are not limited thereto.

Figure 8:
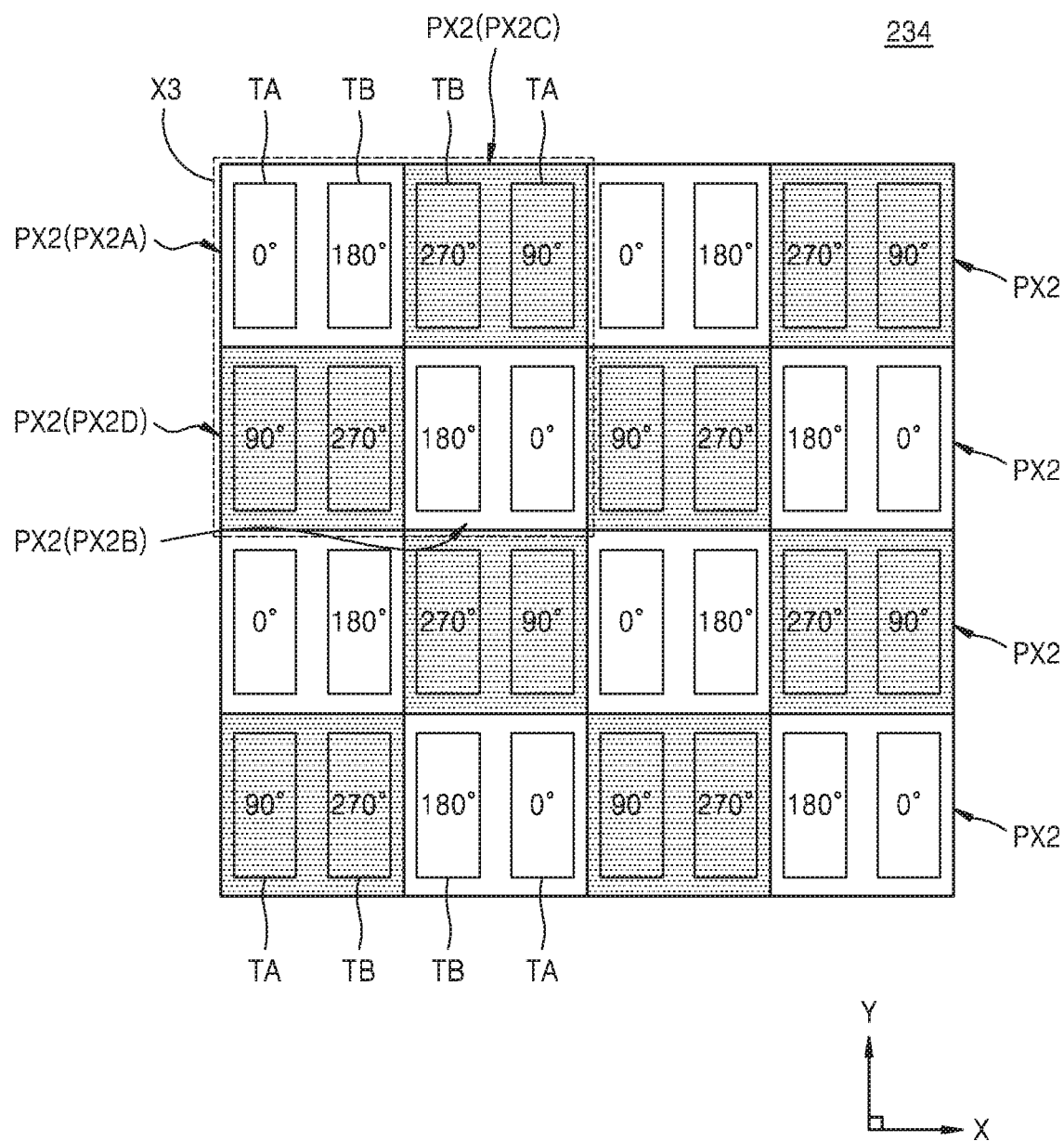
FIG. 8 is a plan view for illustrating example signals applied to a plurality of unit pixels included in an image sensor according to at least one example embodiment.

FIG. 8 is a plan view illustrating example signals applied to the plurality of unit pixels PX2 in the pixel array 234 of FIG. 7 according to at least one example embodiment.

Referring to FIG. 8, the first photo gates PGA of the first taps TA of the first and second unit pixels PX2A and PX2B that are adjacent to each other in a direction along a diagonal line may receive, for example, the 0° signal as the first signal P1, and the second photo gates PGB of the second taps TB may receive, for example, the 180° signal as the second signal P2, but the example embodiments are not limited thereto. In addition, the first photo gates PGA of the third and fourth unit pixels PX2C and PX2D that are adjacent to each other in another direction along another diagonal line may receive, for example, the 90° signal as the first signal P1, and the second photo gates PGB of the second taps TB may receive, for example, the 270° signal as the second signal P2. However, one or more example embodiments are not limited to the examples shown in FIG. 8, and may be variously modified within the technical scope of the inventive concepts.

Figure 9:
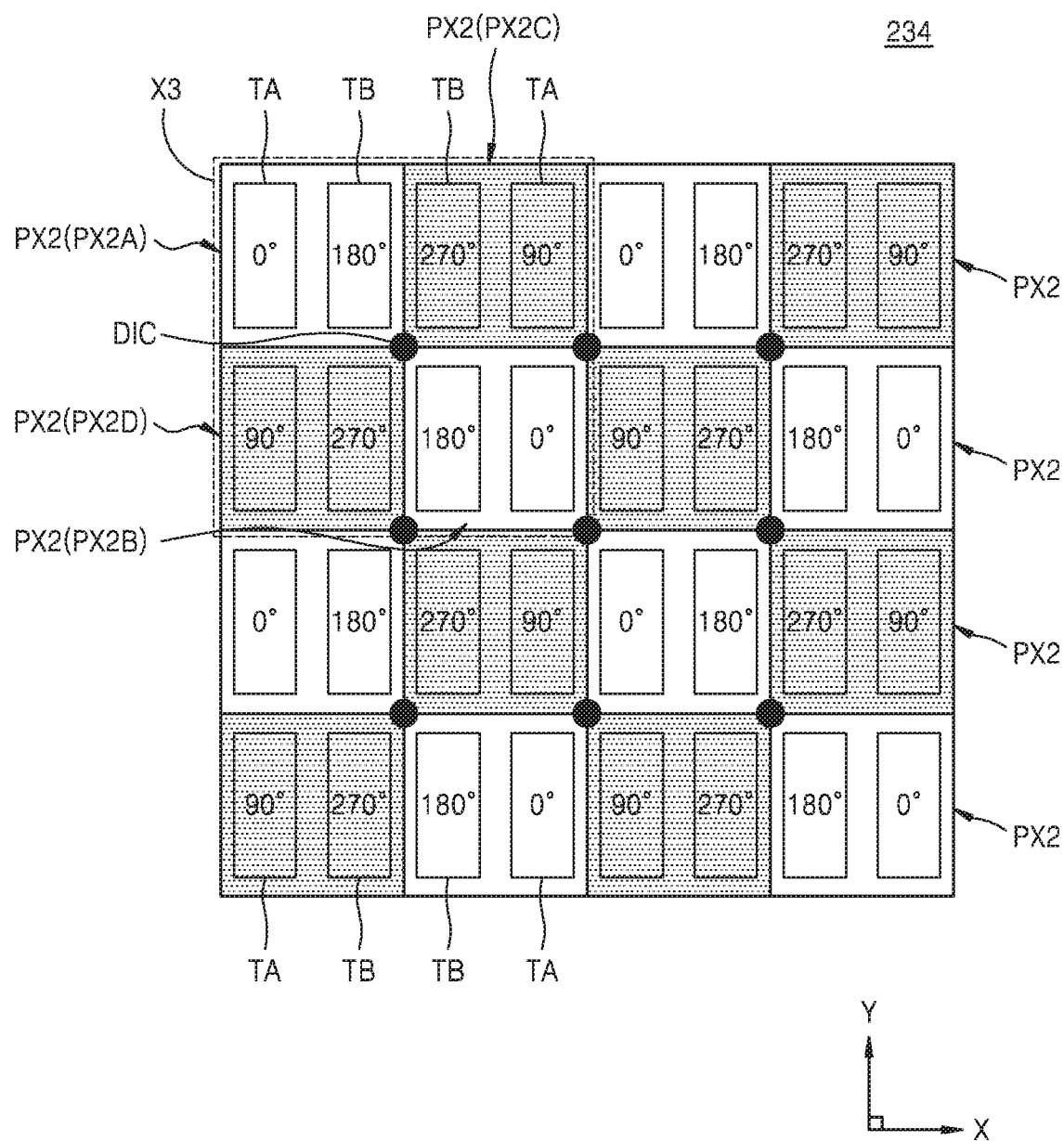
FIG. 9 is a diagram for illustrating an example of tap information in the pixel array of FIG. 8 according to at least one example embodiment.

FIG. 9 is a diagram illustrating tap information according to an example for calculating distance information of the object 5 (see FIG. 1) in the pixel array 234 of FIG. 8 according to at least one example embodiment. In FIG. 9, a plurality of points indicated as DIC may each denote a center point of distance information of the object 5.

Referring to FIG. 9, in order to obtain distance information about and/or corresponding to one distance information center DIC, information obtained from the first and second taps TA and TB in each of the first to fourth unit pixels PX2A, PX2B, PX2C, and PX2D included in the 2×2 pixel array may be used (e.g., the time of flight distance information associated with the DIC may be obtained using the taps of the plurality of unit pixels, etc.), but the example embodiments are not limited thereto.

In the pixel array 234 described above with reference to FIGS. 7 to 9, the first and second taps TA and TB in the two neighboring unit pixels PX2 in the direction along the diagonal line are arranged to be point-symmetrical with each other based on one point, e.g., the first point PT1, and thus, the unit pixels PX2 may receive the light from different positions from one another with respect to one phase difference signal. Therefore, with respect to one phase difference signal, an average of, for example, four pixel signals about different directions may be obtained, but the example embodiments are not limited thereto and the number of pixel signals and directions may be based on the number of unit pixels and/or taps included in the image sensor. Accordingly, even when there is a difference among the sensitivities of the unit pixels PX2 and/or tap asymmetry occurs among the plurality of taps in one unit pixel PX2, errors may be decreased, compensated for, and/or offset and the accuracy in the distance information may be improved over conventional image sensors.

In the image sensor including the pixel array 234 described above with reference to FIGS. 7 to 9, one target unit pixel from which the distance information is to be obtained does not need to perform a remosaic process, in which a plurality pieces of tap information obtained from a plurality of adjacent unit pixels around the target unit pixel have to be processed with the tap information from the target unit pixel in order to obtain more accurate distance information, unlike in the related art.

Figure 10A:
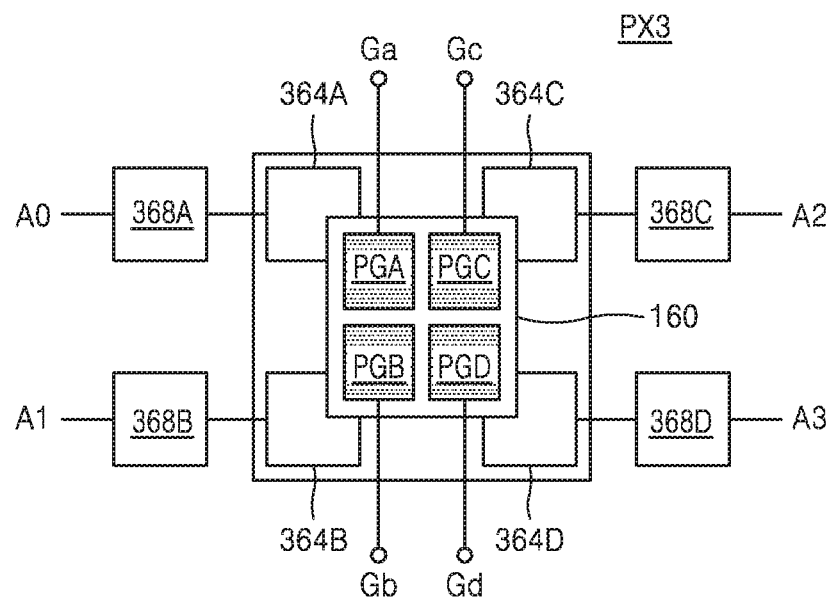
FIG. 10A is a layout for illustrating an example configuration of a unit pixel included in an image sensor according to at least one example embodiment.

FIG. 10A is a layout for illustrating an example of a unit pixel PX3 included in the image sensor 1 according to at least one example embodiment. The unit pixel PX3 shown in FIG. 10A may configure and/or correspond to a unit pixel of the pixel array 34 included in the distance sensor 30 of the image sensor 1 of FIG. 1, but the example embodiments are not limited thereto.

Referring to FIG. 10A, the unit pixel PX3 may be a 4-tap pixel, but is not limited thereto.

The unit pixel PX3 may include a photoelectric conversion region 160, a first photo gate PGA, a second photo gate PGB, a third photo gate PGC, and a fourth photo gate PGD arranged on the photoelectric conversion region 160, and first to fourth detection regions 364A to 364D arranged around the photoelectric conversion region 160, but is not limited thereto. The first detection region 364A is arranged adjacent to the first photo gate PGA, the second detection region 364B is arranged adjacent to the second photo gate PGB, the third detection region 364C is arranged adjacent to the third photo gate PGC, and the fourth detection region 364D is arranged adjacent to the fourth photo gate PGD.

In addition, the unit pixel PX3 may further include a first circuit region 368A for transferring and/or amplifying photo electrons output from the first detection region 364A, a second circuit region 368B for transferring and/or amplifying photo electrons output from the second detection region 364B, a third circuit region 368C for transferring and/or amplifying photo electrons output from the third detection region 364C, and a fourth circuit region 368D for transferring and/or amplifying photo electrons output from the fourth detection region 364D. The first to fourth circuit regions 368A to 368D may each include a plurality of transistors.

Detailed configurations and operations of the first to fourth photo gates PGA, PGB, PGC, and PGD and the first to fourth detection regions 364A, 364B, 364C, and 364D are similar to the descriptions about the first and second photo gates PGA and PGB and the first and second detection regions 164A and 164B with reference to FIG. 2A, but the example embodiments are not limited thereto.

FIG. 10A shows an example in which the unit pixel PX3 has a rectangular planar shape and the first to fourth detection regions 364A to 364D are respectively arranged around corners in a rectangular region defining the unit pixel PX3, but the example embodiments are not limited thereto. Locations of the first to fourth photo gates PGA, PGB, PGC, and PGD and locations of the first to fourth detection regions 364A, 364B, 364C, and 364D in the unit pixel PX3 may be variously changed within the technical scope of the inventive concepts.

Figure 10B:
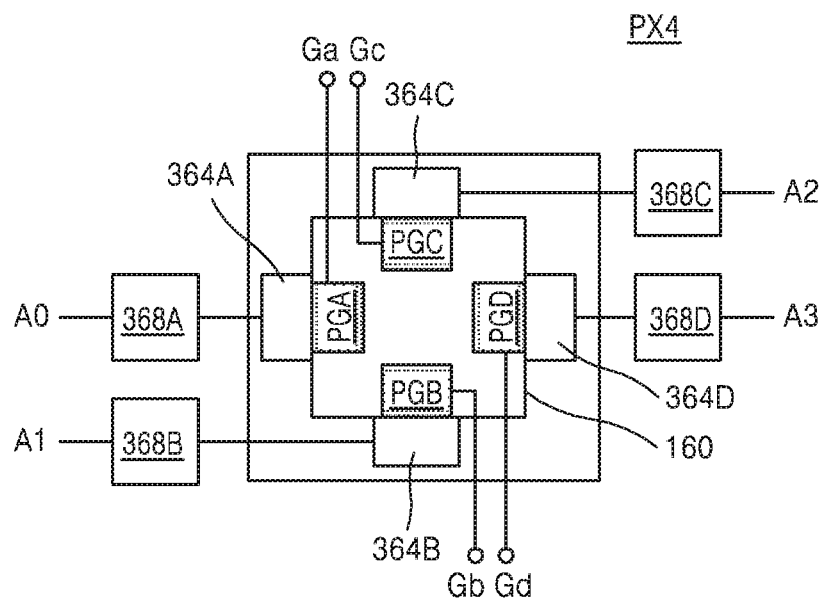
FIG. 10B is a layout for illustrating an example configuration of a unit pixel included in an image sensor according to at least one example embodiment.

FIG. 10B is a layout for illustrating an example of a unit pixel PX4 included in the image sensor 1 according to at least one example embodiment. The unit pixel PX4 shown in FIG. 10B may configure and/or correspond to a unit pixel of the pixel array 34 included in the distance sensor 30 of the image sensor 1 of FIG. 1, but the example embodiments are not limited thereto.

The unit pixel PX4 of FIG. 10B may have a similar structure to the unit pixel PX3 shown in FIG. 10A, but the example embodiments are not limited thereto. However, the first to fourth detection regions 364A, 364B, 364C, and 364D are arranged on regions along sides of the rectangular region away from the corners of the rectangular region defining each unit pixel PX3, and the first to fourth photo gates PGA, PGB, PGC, and PGD may be arranged on regions facing the sides of the rectangular region to correspond to the first to fourth detection regions 364A, 364B, 364C, and 364D.

Figure 10C:
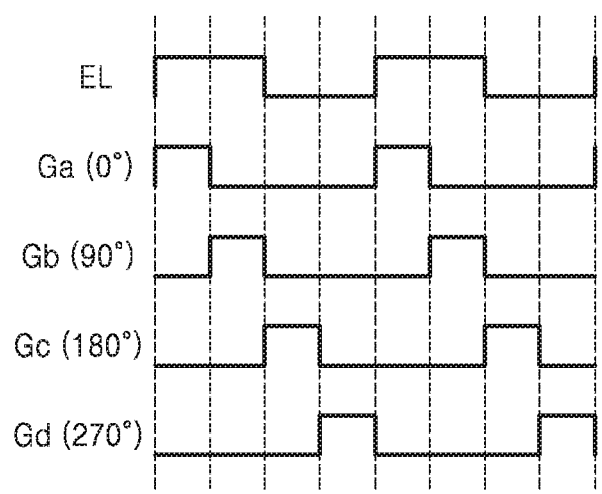
FIG. 10C is a graph showing a phase difference between photo-gate signals applied to a unit pixel included in an image sensor according to at least one example embodiment and an optical signal.

FIG. 10C is a graph showing phase differences between the first to fourth photo gate signals Ga, Gb, Gc, and Gd applied to the unit pixels PX3 and PX4 of FIGS. 10A and 10B and the optical signal EL according to at least one example embodiment.

Referring to FIGS. 10A to 10C, the first to fourth photo gate signals Ga, Gb, Gc, and Gd having phase differences of, for example, 90° from one another are applied to the first to fourth photo gates Ga, Gb, Gc, and Gd, and photo electrons may be output to the first to fourth detection regions 364A, 364B, 364C, and 364D in response to the first to fourth photo gate signals Ga, Gb, Gc, and Gd. The photo electrons output to the first to fourth detection regions 364A, 364B, 364C, and 364D are transferred and/or amplified via the first to fourth circuit regions 368A, 368B, 368C, and 368D, and may be output as first to fourth pixel signals A0, A1, A2, and A3.

The first to fourth photo gate signals Ga, Gb, Gc, and Gd may be applied to each of the unit pixels PX3 and PX4 each including 4-tap pixel. In the unit pixels PX3 and PX4, the photo electrons generated from the reflected optical signal RL (see FIG. 1) are accumulated for a desired and/or predetermined time period, and when the unit pixels PX3 and PX4 perform a sampling operation once, the first to fourth pixel signals A0, A1, A2, and A3 respectively corresponding to the first to fourth photo gate signals Ga, Gb, Gc, and Gd may be generated.

Figure 10D:
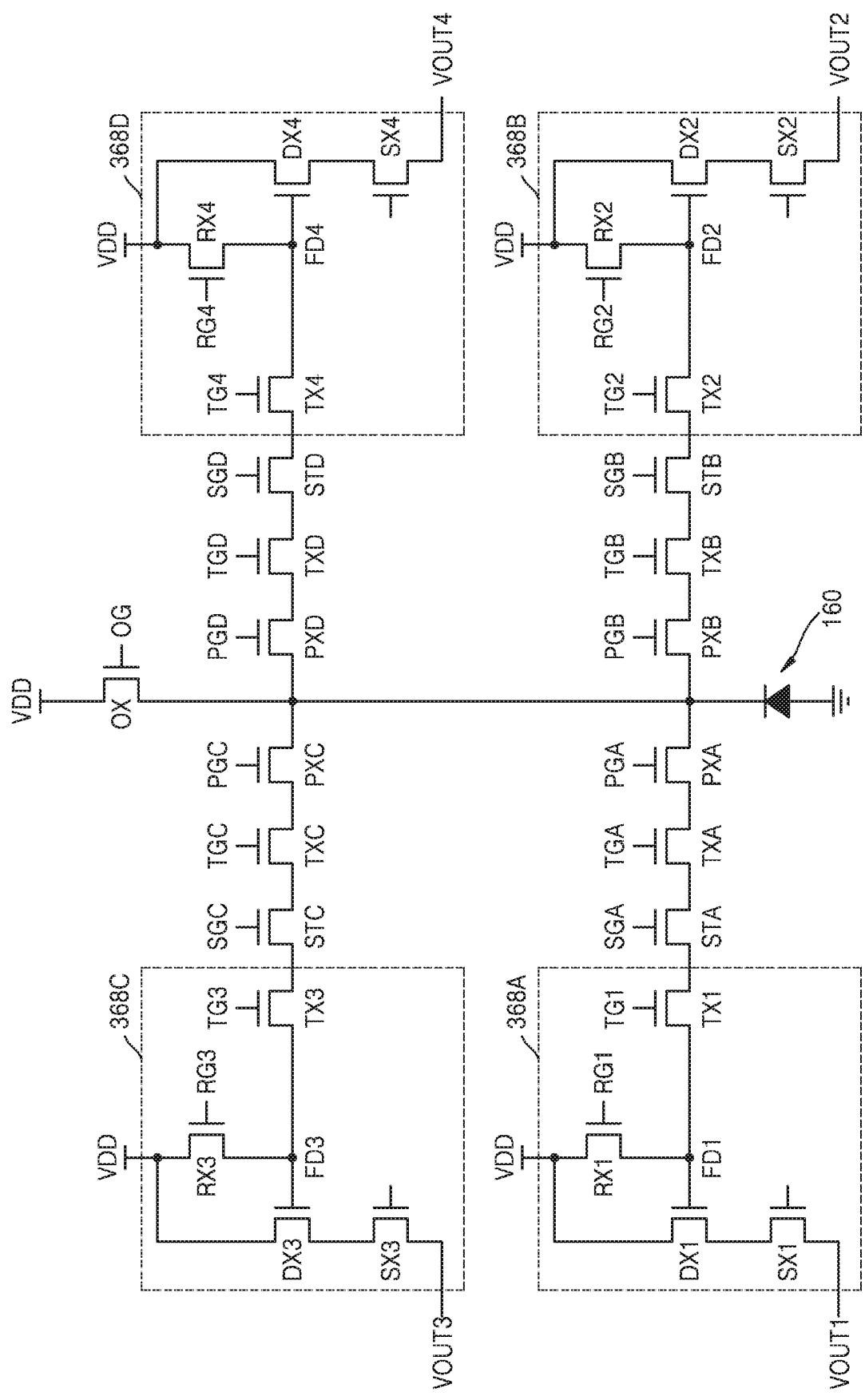
FIG. 10D is a circuit diagram of an example of a unit pixel included in an image sensor according to at least one example embodiment.

FIG. 10D is an example circuit diagram of the unit pixel PX3 of FIG. 10A according to at least one example embodiment. The circuit diagram of FIG. 10D may be applied to the unit pixel PX4 shown in FIG. 10B. In FIG. 10D, like reference numerals as those of FIG. 2D denote the same elements, and descriptions thereof are omitted for convenience of description.

Referring to FIG. 10D, the unit pixel PX3 includes first to fourth photoelectric conversion devices PXA, PXB, PXC, and PXD connected to the photoelectric conversion region 160. Detailed configurations of the first photoelectric conversion device PXA and the second photoelectric conversion device PXB are described above with reference to FIG. 2D. The third photoelectric conversion device PXC may include the third photo gate PGC, and the fourth photoelectric conversion device PXD may include the fourth photo gate PGD. In the third and fourth photoelectric conversion devices PXC and PXD, electrons may be accumulated due to voltages of the signals applied to the third and fourth photo gates PGC and PGD in a similar way to the above descriptions about the first and second photoelectric conversion devices PXA and PXB with reference to FIG. 2D.

The unit pixel PX3 may include a third shutter transistor TXC connected to the third photoelectric conversion device PXC, a third storage transistor STC, a third transfer transistor TX3, a third drive transistor DX3, a third selection transistor SX3, and a third reset transistor RX3. Also, the unit pixel PX3 may include a fourth shutter transistor TXD connected to the fourth photoelectric conversion device PXD, a fourth storage transistor STD, a fourth transfer transistor TX4, a fourth drive transistor DX4, a fourth selection transistor SX4, and a fourth reset transistor RX4.

The third and fourth shutter transistors TXC and TXD may selectively turn on/off transmission of the photocharges that are transferred from the photoelectric conversion region 160 to the third and fourth storage transistors STC and STD in response to signals applied to third and fourth shutter gates TGC and TGD.

The third and fourth storage transistors STC and STD may store the photocharges transferred through the third and fourth shutter transistors TXC and TXD in response to storage control signals respectively applied to third and fourth storage gates SGC and SGD.

The third and fourth transfer transistors TX3 and TX4 may transfer the photocharges stored in storage areas of the third and fourth storage transistors STC and STD to third and fourth floating diffusion regions FD3 and FD4, in response to transfer control signals applied to third and fourth transfer gates TG3 and TG4. The third and fourth transfer transistors TX3 and TX4 may turn on/off electric connection between the third storage transistor STC and the third floating diffusion region FD3 and electric connection between the fourth storage transistor STD and the fourth floating diffusion region FD4, according to the transfer control signals applied to the third and fourth transfer gates TG3 and TG4.

The third and fourth reset transistors RX3 and RX4 detect pixel information based on the voltages of the third and fourth floating diffusion regions FD3 and FD4, and after that, may initialize the third and fourth floating diffusion regions FD3 and FD4 to a power voltage VDD level according to the reset signal applied to the third and fourth reset gates RG3 and RG4.

The third and fourth drive transistors DX3 and DX4 and the third and fourth selection transistors SX3 and SX4 may have nearly same configurations and functions as those of the first and second drive transistors DX1 and DX2 and the first and second selection transistors SX1 and SX2 described above with reference to FIG. 2D. The third and fourth selection transistors SX3 and SX4 may output the voltages amplified by the third and fourth drive transistors DX3 and DX4 as third and fourth output voltage VOUT3 and VOUT4, in response to the selection signals applied to the gates thereof.

The first transfer transistor TX1, the first drive transistor DX1, the first selection transistor SX1, the first reset transistor RX1, and the first floating diffusion region FD1 may configure (e.g., may be included in) the first circuit region 368A. The second transfer transistor TX2, the second drive transistor DX2, the second selection transistor SX2, the second reset transistor RX2, and the second floating diffusion region FD2 may configure (e.g., may be included in) the second circuit region 368B. The third transfer transistor TX3, the third drive transistor DX3, the third selection transistor SX3, the third reset transistor RX3, and the third floating diffusion region FD3 may configure (e.g., may be included in) the third circuit region 368C. The fourth transfer transistor TX4, the fourth drive transistor DX4, the fourth selection transistor SX4, the fourth reset transistor RX4, and the fourth floating diffusion region FD4 may configure (e.g., may be included in) the fourth circuit region 368D.

The circuit configuration of the unit pixel PX3 shown in FIG. 10D is an example and may be modified variously within the scope of the inventive concepts. For example, at least one of the first to fourth shutter transistors TXA, TXB, TXC, and TXD, the first to fourth storage transistors STA, STB, STC, and STD, the first to fourth transfer transistors TX1, TX2, TX3, and TX4, and the overflow transistor OX may be omitted, etc.

Figure 11:
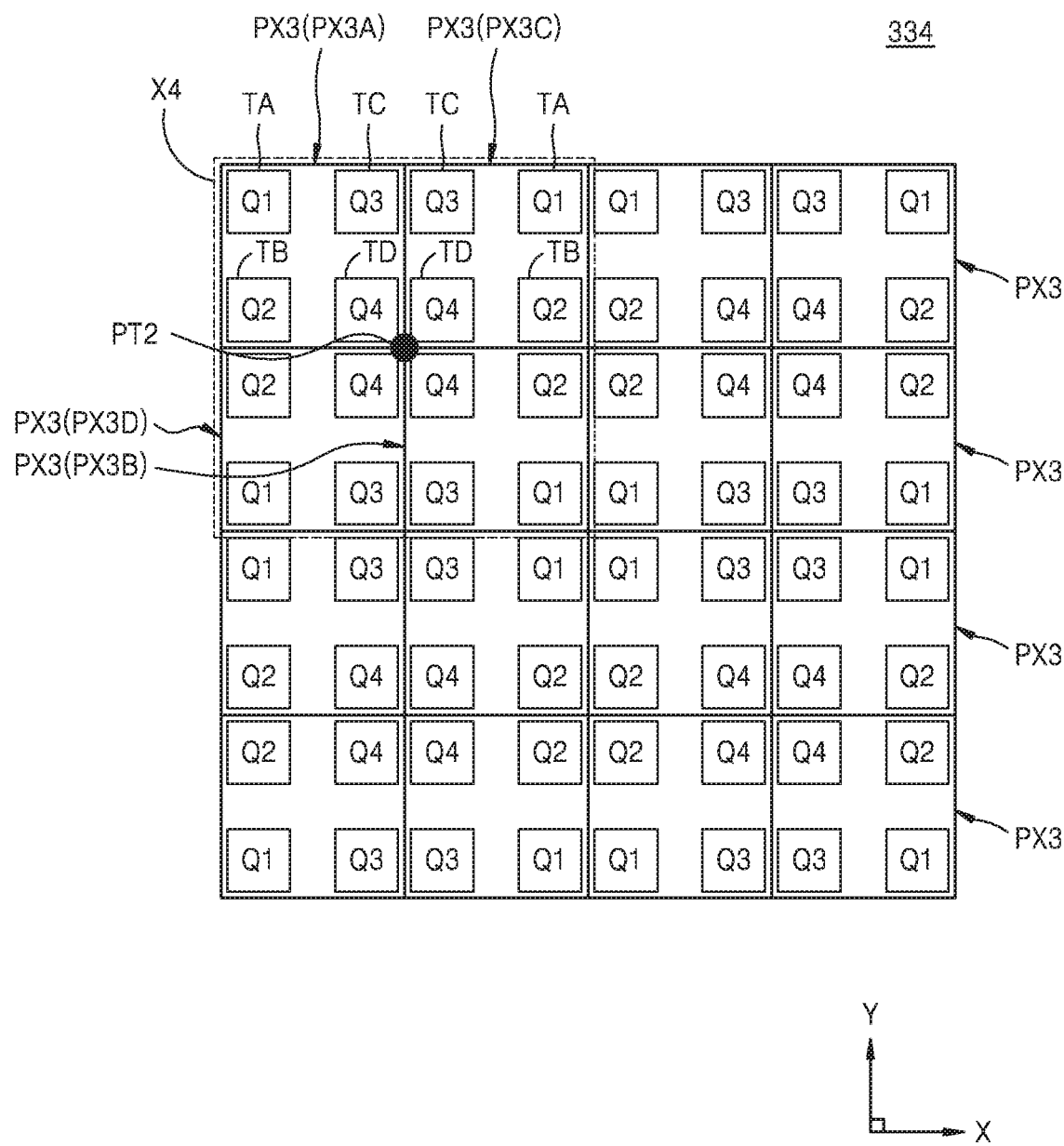
FIG. 11 is a layout for illustrating an example configuration of a pixel array included in an image sensor according to at least one example embodiment.

FIG. 11 is a layout for illustrating an example configuration of a pixel array 334 included in the image sensor 1 according to at least one example embodiment. The pixel array 334 shown in FIG. 11 may configure and/or may correspond to the pixel array 34 included in the distance sensor 30 of the image sensor 1 of FIG. 1, but the example embodiments are not limited thereto.

Referring to FIGS. 10A and 11, the pixel array 334 may include a plurality of unit pixels PX3 arranged as a matrix in a row line direction (X direction) and a column line direction (Y direction). The plurality of unit pixels PX3 may each include a 4-tap pixel, but the example embodiments are not limited thereto. For example, each of the plurality of unit pixels PX3 may include the first tap TA including the first photo gate PGA and the first detection region 364A, the second tap TB including the second photo gate PGB and the second detection region 364B, a third tap TC including the third photo gate PGC and the third detection region 364C, and a fourth tap TD including the fourth photo gate PGD and the fourth detection region 364D, etc. In FIG. 11, first to fourth signals Q1, Q2, Q3, and Q4 applied to the first to fourth photo gates PGA, PGB, PGC, and PGD of the first to fourth taps TA, TB, TC, and TD are indicated on the first to fourth taps TA, TB, TC, and TD in each of the plurality of unit pixels PX3 included in the pixel array 334, according to at least one example embodiment.

It may be configured that the first to fourth signals Q1, Q2, Q3, and Q4 having different phase differences from one another are applied to the first to fourth photo gates PGA, PGB, PGC, and PGD included in the first to fourth taps TA, TB, TC, and TD in each of the plurality of unit pixels PX3. The first to fourth signals Q1, Q2, Q3, and Q4 may be different signals respectively selected from, e.g., the 0° signal, 90° signal, 180° signal, and 270° signal, but the example embodiments are not limited thereto. In some example embodiments, the first signal Q1 may be the 0° signal, the second signal Q2 may be the 90° signal, the third signal Q3 may be the 180° signal, and the fourth signal Q4 may be the 270° signal, but the example embodiments are not limited thereto and other signal degree types may be used for the signals.

For example, in the pixel array 334, locations of the first to fourth taps TA, TB, TC, and TD included in two neighboring unit pixels in a row line direction or a column line direction, from among the plurality of unit pixels PX3 may be line-symmetrical with respect to one another based on one straight line extending between the two neighboring unit pixels PX3, but the example embodiments are not limited thereto.

For example, the pixel array 334 may include first to fourth unit pixels PX3A, PX3B, PX3C, and PX3D configuring a, e.g., 2×2 pixel array as in a region indicated by a dashed line X4. Among the plurality of unit pixels PX3, the first unit pixel PX3A and the third unit pixel PX3C shown in an upper left portion of FIG. 11 are adjacent to each other in the row line direction, and in the first and third unit pixels PX3A and PX3C, locations of the first to fourth taps TA, TB, TC, and TD may be line-symmetrical with respect to one another based on one straight line extending in the Y direction between the first and third unit pixels PX3A and PX3C. Among the plurality of unit pixels PX3, the second unit pixel PX3B and the fourth unit pixel PX3D shown in the upper left portion of FIG. 11 are adjacent to each other in the row line direction, and in the second and fourth unit pixels PX3B and PX3D, locations of the first to fourth taps TA, TB, TC, and TD may be line-symmetrical with respect to one another based on one straight line extending in the Y direction between the second and fourth unit pixels PX3B and PX3D.

In addition, among the plurality of unit pixels PX3, the first unit pixel PX3A and the fourth unit pixel PX3D shown in the upper left portion of FIG. 11 are adjacent to each other in the column line direction, and in the first and fourth unit pixels PX3A and PX3D, locations of the first to fourth taps TA, TB, TC, and TD may be line-symmetrical with respect to one another based on one straight line extending in the X direction between the first and fourth unit pixels PX3A and PX3D. Among the plurality of unit pixels PX3, the second unit pixel PX3B and the third unit pixel PX3C shown in an upper left portion of FIG. 11 are adjacent to each other in the column line direction, and in the second and third unit pixels PX3B and PX3C, locations of the first to fourth taps TA, TB, TC, and TD may be line-symmetrical with respect to one another based on one straight line extending in the X direction between the second and third unit pixels PX3B and PX3C.

According to at least one example embodiment, in four unit pixels PX3 configuring (e.g., included in) the 2×2 pixel array from among the plurality of unit pixels PX3 of the pixel array 334, locations of the first to fourth taps TA, TB, TC, and TD included in two neighboring unit pixels PX3 in a direction along a diagonal line in the 2×2 pixel array may be point-symmetrical with respect to one another based on one point on the diagonal line, but the example embodiments are not limited thereto.

For example, from among the first to fourth unit pixels PX3A, PX3B, PX3C, and PX3D configuring the 2×2 pixel array in the region indicated by the dashed line X4, a location of each of the first to fourth taps TA, TB, TC, and TD included in each of the first and second unit pixels PX3A and PX3B that are adjacent to each other in a direction along a diagonal line in the 2×2 pixel array may be point-symmetrical with each other based on one point, for example, a second point PT2 on the diagonal line. Also, from among the first to fourth unit pixels PX3A, PX3B, PX3C, and PX3D configuring the 2×2 pixel array in the region indicated by the dashed line X4, a location of each of the first to fourth taps TA, TB, TC, and TD included in each of the third and fourth unit pixels PX3C and PX3D that are adjacent to each other in another direction along another diagonal line in the 2×2 pixel array may be point-symmetrical with each other based on one point, for example, a second point PT2 on the another diagonal line.

In some example embodiments, from among the first to fourth unit pixels PX3A, PX3B, PX3C, and PX3D included in the 2×2 pixel array within the region indicated by the dashed line X4, distances from the second point PT2 to the first taps TA in the first to fourth unit pixels PX3A, PX3B, PX3C, and PX3D may be substantially equal to one another, distances from the second point PT2 to the second taps TB in the first to fourth unit pixels PX3A, PX3B, PX3C, and PX3D may be substantially equal to one another, distances from the second point PT2 to the third taps TC in the first to fourth unit pixels PX3A, PX3B, PX3C, and PX3D may be substantially equal to one another, and distances from the second point PT2 to the fourth taps TD in the first to fourth unit pixels PX3A, PX3B, PX3C, and PX3D may be substantially equal to one another, but the example embodiments are not limited thereto.

Figure 12:
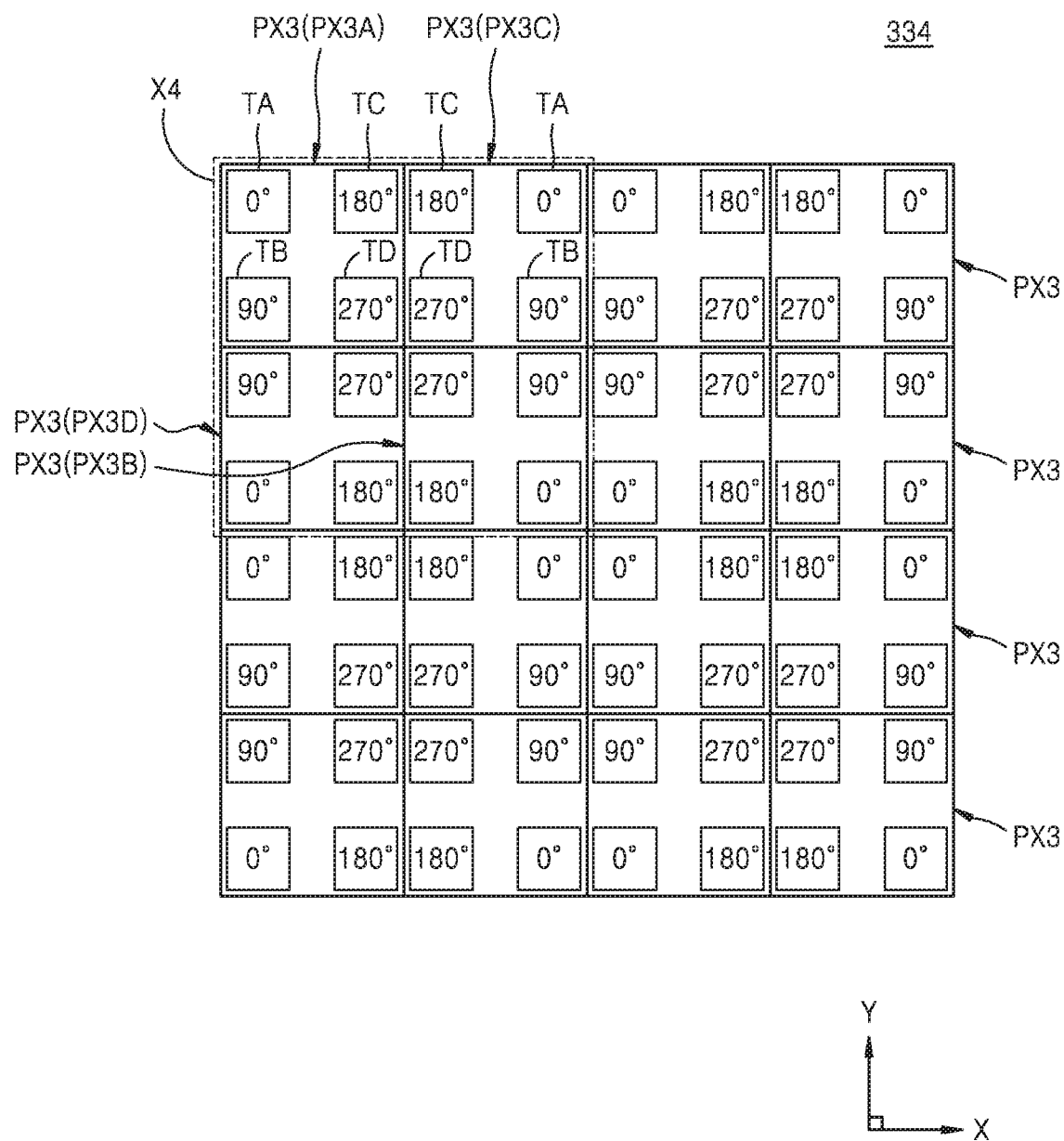
FIG. 12 is a plan view for illustrating example signals applied to a plurality of unit pixels included in an image sensor according to at least one example embodiment.

FIG. 12 is a plan view for illustrating example signals applied to the first to fourth taps TA, TB, TC, and TD in each of the plurality of unit pixels PX3 in the pixel array 334 of FIG. 11 according to at least one example embodiment.

Referring to FIGS. 10A, 11, and 12, in each of the plurality of unit pixels PX3 of the pixel array 334, the first photo gate PGA of the first tap TA receives the 0° signal as the first signal Q1, the second photo gate PGB of the second tap TB receives the 90° signal as the second signal Q2, the third photo gate PGC of the third tap TC receives the 180° signal as the third signal Q3, and the fourth photo gate PGD of the fourth tap TD receives the 270° signal as the fourth signal Q4. However, the example embodiments are not limited to the example of FIG. 12, and signals applied to the first to fourth taps TA, TB, TC, and TD may be variously modified.

Figure 13:
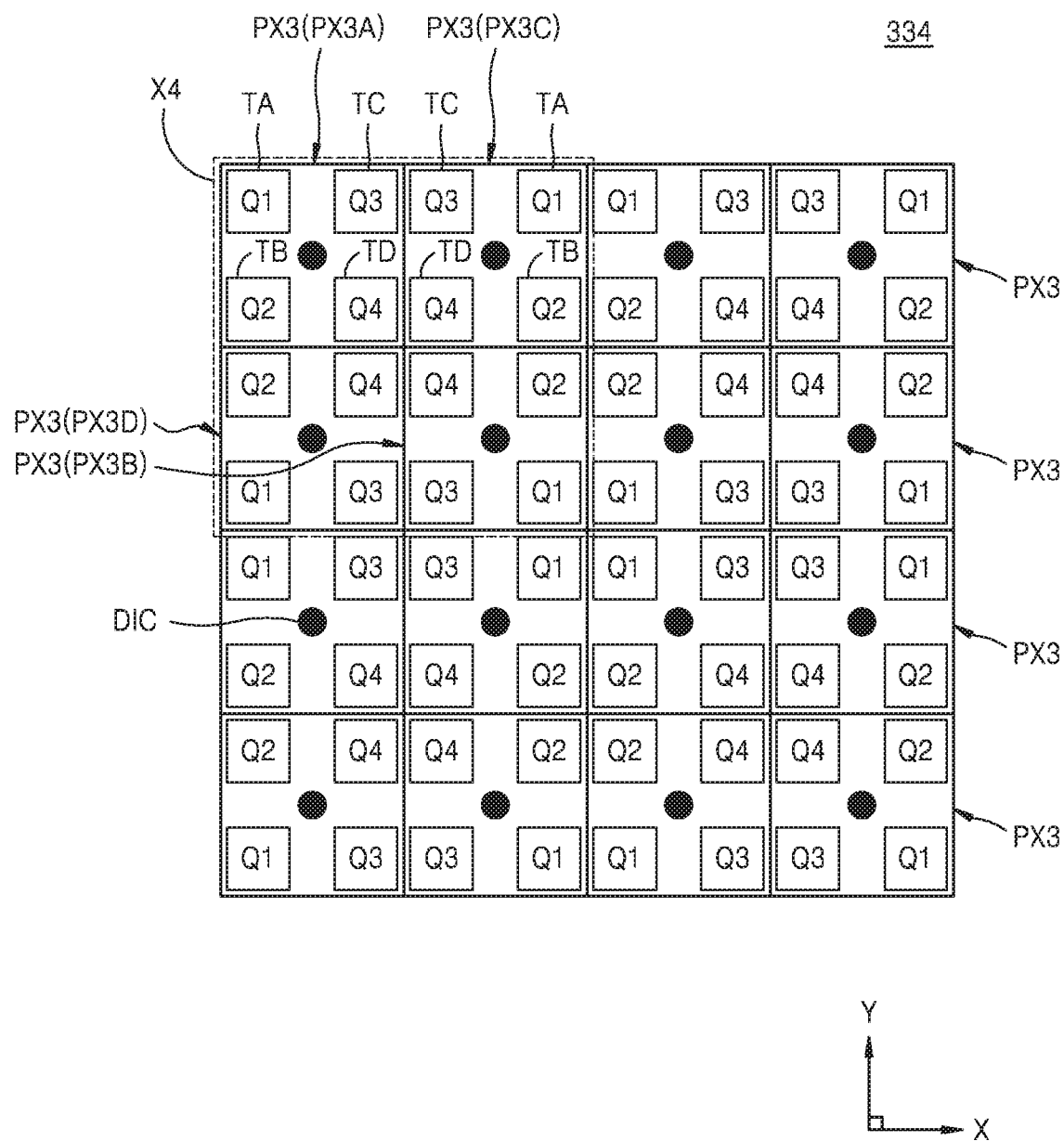
FIG. 13 is a diagram for illustrating an example of tap information in the pixel array of FIG. 11 according to at least one example embodiment.

FIG. 13 is a diagram illustrating tap information according to an example for calculating distance information of the object 5 (see FIG. 1) in the pixel array 334 of FIG. 11 according to at least one example embodiment. In FIG. 13, a plurality of points indicated as DIC may each denote a center point of distance information of the object 5.

Referring to FIG. 13, distance information about and/or corresponding to the distance information center DIC may be obtained by using information from the first to fourth taps TA, TB, TC, and TD in each of the plurality of unit pixels PX3 in a full-mode (e.g., the time of flight distance information associated with the DIC may be obtained using the taps of the plurality of unit pixels, etc.). As used herein, the term "full-mode" may denote performing of a sampling and holding, and an analog-digital converting operation on voltages sensed by all the pixels included in the pixel array 334 (or the pixel array 34 of FIG. 1), but the example embodiments are not limited thereto.

As shown in FIG. 13, in a case where the distance information about the distance information center DIC is obtained from each of the plurality of unit pixels PX3 in the full-mode, since locations to which the first to fourth signals Q1, Q2, Q3, and Q4 are applied vary in the first to fourth unit pixels PX3A, PX3B, PX3C, and PX3D configuring the 2×2 pixel array within the region indicated by, for example, the dashed line X4, distance information about the first to fourth signals Q1, Q2, Q3, and Q4 obtained from each of the first to fourth unit pixels PX3A, PX3B, PX3C, and PX3D may be different from the other unit pixels, however the example embodiments are not limited thereto.

Figure 14:
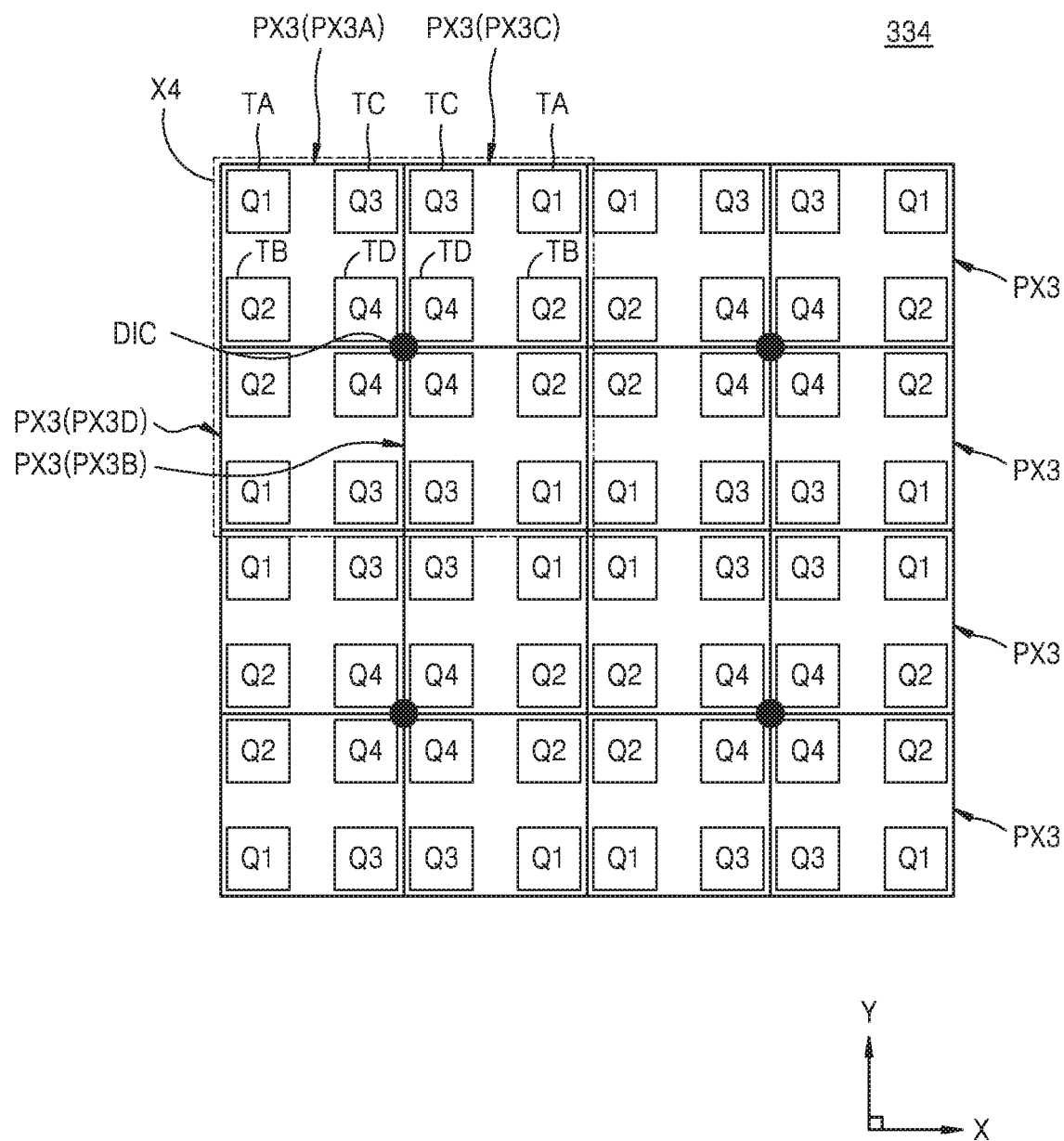
FIG. 14 is a diagram for illustrating another example of tap information in the pixel array of FIG. 11 according to at least one example embodiment.

FIG. 14 is a diagram illustrating tap information according to another example for calculating distance information of the object 5 (see FIG. 1) in the pixel array 334 of FIG. 11 according to at least one example embodiment. In FIG. 14, a plurality of points indicated as DIC may each denote a center point of distance information of the object 5, etc.

Referring to FIG. 14, in a binning mode, distance information about the distance information center DIC may be obtained by using information from the first to fourth taps TA, TB, TC, and TD in each of the first to fourth unit pixels PX3A, PX3B, PX3C, and PX3D included in the 2×2 pixel array within the region indicated by the dashed line X4, but the example embodiments are not limited thereto. As used herein, the term "binning mode" may denote a mode in which an added value of pixel values of some adjacent unit pixels PX3 are added (or averaged) from among the plurality of unit pixels PX3 included in the pixel array 334 (or the pixel array 34 of FIG. 1), unlike the full-mode described above with reference to FIG. 13.

As shown in FIG. 14, when the distance information is obtained in a 2×2 binning mode about the first to fourth unit pixels PX3A, PX3B, PX3C, and PX3D included in the 2×2 pixel array, information from the first to fourth taps TA, TB, TC, and TD in each of the first to fourth unit pixels PX3A, PX3B, PX3C, and PX3D of the 2×2 pixel array may be analog summed and/or averaged in order to obtain the distance information about and/or corresponding to one distance information center DIC. In this case, since the first to fourth unit pixels PX3A, PX3B, PX3C, and PX3D have different locations to which the first to fourth signals Q1, Q2, Q3, and Q4 are applied from one another, average distance information about the first to fourth signals Q1, Q2, Q3, and Q4 applied to each of the first to fourth unit pixels PX3A, PX3B, PX3C, and PX3D may be automatically obtained.

The distance information may be obtained from all the unit pixels PX3 included in the pixel array 334 in the above-described 2×2 binning mode, as well as the first to fourth unit pixels PX3A, PX3B, PX3C, and PX3D within the region indicated by the dashed line X4 in FIG. 14.

Accordingly, the tap asymmetry that each of the unit pixels PX3 may have may be offset, and thus, the accuracy in the distance information may be improved.

Figure 15:
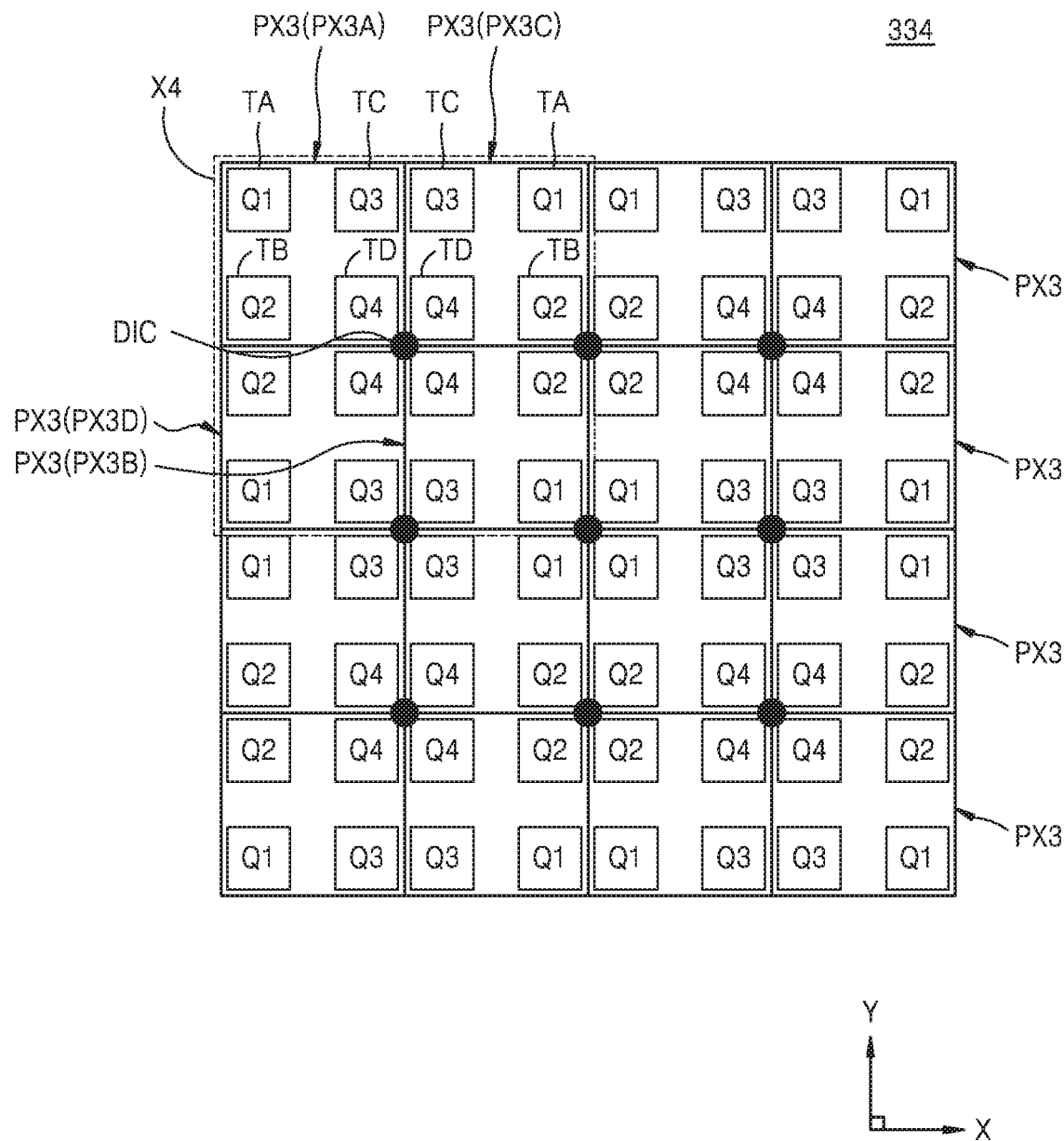
FIG. 15 is a diagram for illustrating another example of tap information in the pixel array of FIG. 11 according to at least one example embodiment.

FIG. 15 is a diagram illustrating tap information according to another example for calculating distance information of the object 5 (see FIG. 1) in the pixel array 334 of FIG. 11 according to at least one example embodiment. In FIG. 15, a plurality of points indicated as DIC may each denote a center point of distance information of the object 5.

Referring to FIG. 15, distance information about and/or corresponding to the distance information center DIC may be obtained by a digital binning method, but the example embodiments are not limited thereto. To do this, a pixel value of each of the plurality of unit pixels PX3 is obtained in the full-mode according to the method described with reference to FIG. 13, and the pixel values obtained as above may be processed by an analog-digital converter (ADC) of the CDS/ADC circuit 36 to obtain digital signals. After that, digital signals with respect to four unit pixels PX3 in the 2×2 pixel array based on the distance information center DIC shown in FIG. 15 are synthesized to obtain final distance information, but the example embodiments are not limited thereto. In this case, a signal-to-noise ratio is improved, and thus, there is no need to perform an additional low pass filtering process for reducing noise.

In some example embodiments, if desired and/or necessary, four pixel signals about one phase difference signal from the four unit pixels PX3 in the 2×2 pixel array based on the distance information center DIC as a center shown in FIG. 15 may be summed, wherein the one phase difference signal is closest to the distance information center DIC from among the first to fourth signals Q1, Q2, Q3, and Q4. For example, from the first to fourth unit pixels PX3A, PX3B, PX3C, and PX3D included in the 2×2 pixel array within the region indicated by the dashed line X4, four pixel signals about four fourth signals Q4 that are closest to the distance information center DIC may be summed, but the example embodiments are not limited thereto.

Figure 16:
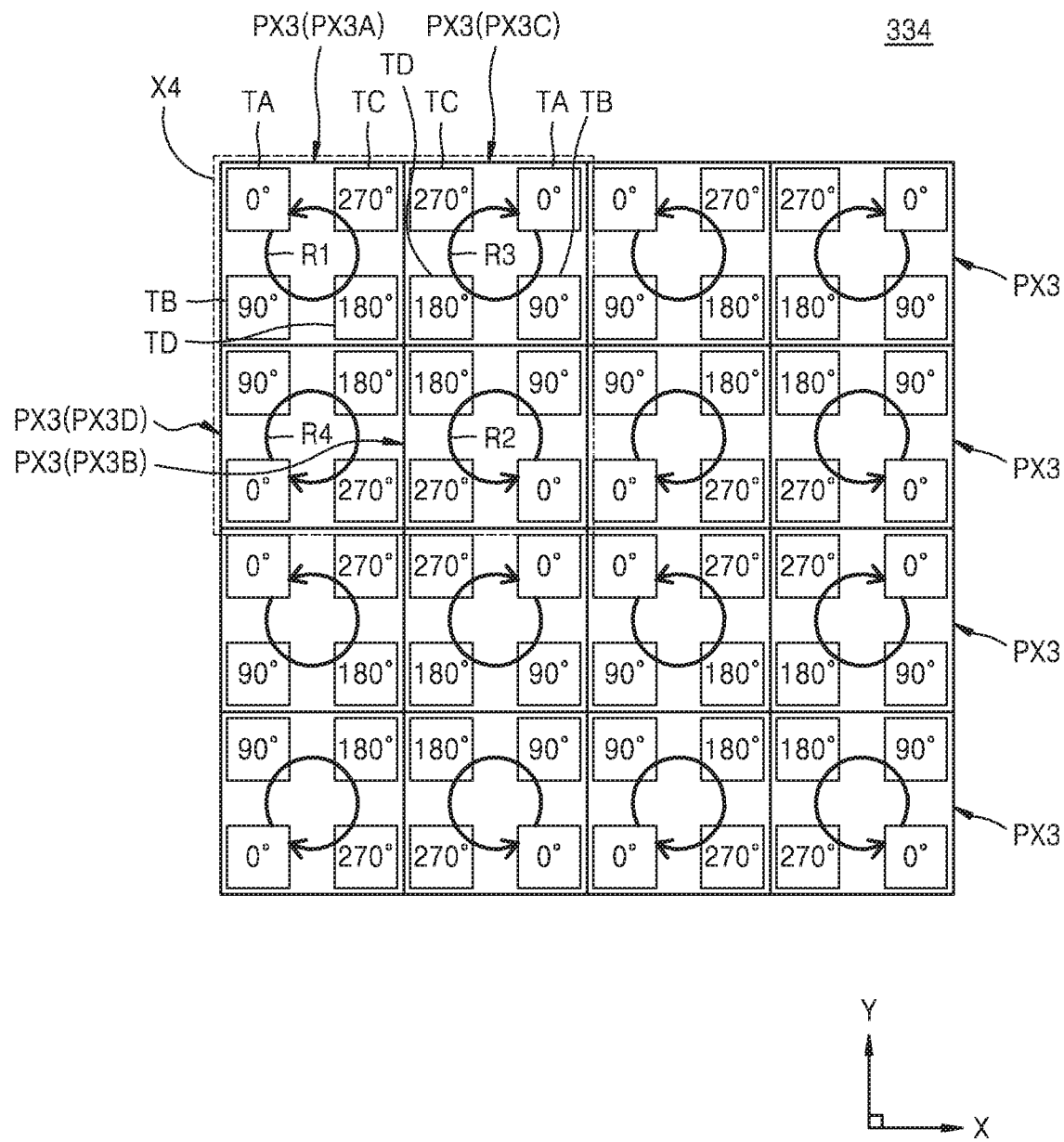
FIG. 16 is a plan view for illustrating example signals applied to a plurality of unit pixels in the pixel array of FIG. 11 according to at least one example embodiment.

FIG. 16 is a plan view for illustrating other example signals applied to the first to fourth taps TA, TB, TC, and TD in each of the plurality of unit pixels PX3 in the pixel array 334 of FIG. 11 according to at least one example embodiment, but the example embodiments are not limited thereto.

Referring to FIG. 16, from among the plurality of unit pixels PX3 included in the pixel array 334, signals applied to the first to fourth photo gates PGA, PGB, PGC, and PGD of the first to fourth taps TA, TB, TC, and TD may be configured to have phase differences that sequentially increase along a circulation path in one of a clockwise direction and a counter-clockwise direction. Among the plurality of unit pixels PX3 included in the pixel array 334, the first to fourth taps TA, TB, TC, and TD may be arranged with substantially constant intervals therebetween along the circulation path in one of the clockwise direction and the counter-clockwise direction, but the example embodiments are not limited thereto.

For example, the first to fourth unit pixels PX3A, PX3B, PX3C, and PX3D included in the 2×2 pixel array within the region indicated by the dashed line X4 in FIG. 16 may be configured to have phase differences, values of which sequentially increase along a circulation path in one of the clockwise direction and the counter-clockwise direction as denoted by arrows R1, R2, R3, and R4. Also, in the first to fourth unit pixels PX3A, PX3B, PX3C, and PX3D included in the 2×2 pixel array, two unit pixels PX3 that are adjacent to each other in a direction along a diagonal line of the 2×2 pixel array may be arranged in the same circulation direction, and two unit pixels PX3 that are adjacent to each other in the row line direction or the column line direction may be arranged in opposite circulation paths to each other.

As shown in FIG. 16, the first unit pixel PX3A and the second unit pixel PX3B may be configured so that signals having phase differences that are sequentially increased along a circulation path in the counter-clockwise direction may be applied to the first to fourth photo gates PGA, PGB, PGC, and PGD of the first to fourth taps TA, TB, TC, and TD as indicated by the arrows R1 and R2. In addition, the third unit pixel PX3C and the fourth unit pixel PX3D may be configured so that signals having phase differences that are sequentially increased along a circulation path in the clockwise direction may be applied to the first to fourth photo gates PGA, PGB, PGC, and PGD of the first to fourth taps TA, TB, TC, and TD as indicated by the arrows R3 and R4.

As shown in FIG. 16, in a case where the phase differences of the signals applied to the first to fourth photo gates PGA, PGB, PGC, and PGD of the first to fourth taps TA, TB, TC, and TD are configured to have values sequentially increasing along the circulation path in the plurality of unit pixels PX3, a transfer distance of the charges between a reference tap having a certain phase difference and a previous tap of the reference tap may be equal to a transfer distance of the charges between the reference tap and a next tap of the reference tap during a modulation operation. Therefore, in one unit pixel PX3, the transfer distance of the charges with respect to each of the phase difference signals that are different from each other and applied respectively to the first to fourth taps TA, TB, TC, and TD may be controlled and/or constantly controlled, and issues generated according to the tap asymmetry caused by differences in the transfer speeds of the charges transferred to each of the taps, e.g., first to fourth taps TA, TB, TC, and TD, in one unit pixel, e.g., unit pixel PX3, may be addressed. Also, uniform sensitivities of the taps in the unit pixel, e.g., the first to fourth taps TA, TB, TC, and TD in the unit pixel PX3, may be maintained even when pulse operations of each phase difference signal are unclear in a demodulation process.

Figure 17:
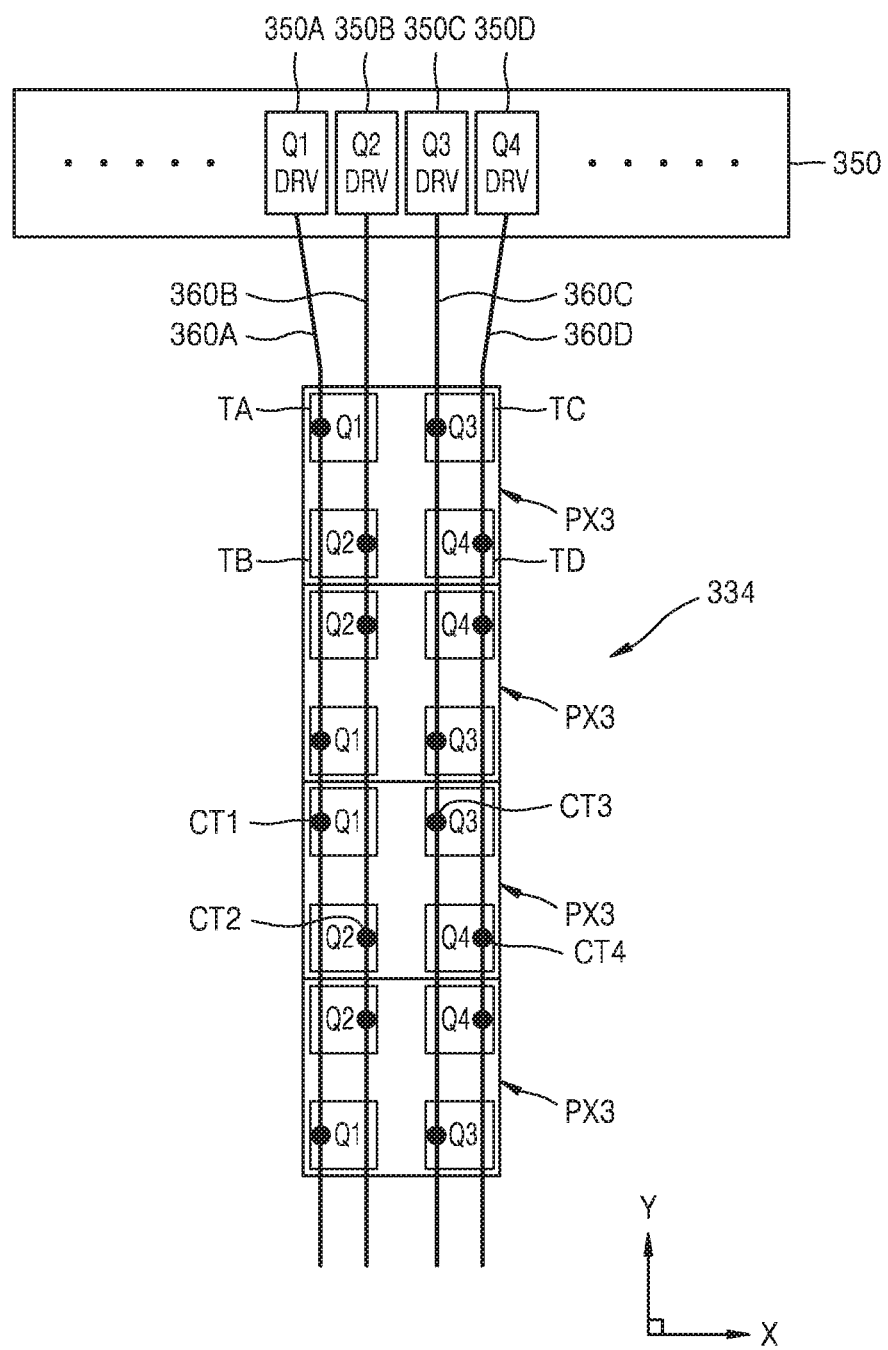
FIG. 17 is a diagram for illustrating another example of a connecting relation between a pixel array and a photo gate driver circuit unit in an image sensor according to at least one example embodiment.

FIG. 17 is a diagram illustrating an example of a connecting relation between the pixel array 334 and a photo gate driver circuit unit 350 used to drive the pixel array 334, in a case where the image sensor according to at least one example embodiment includes the pixel array 334 of FIG. 11. FIG. 17 only shows the plurality of unit pixels PX3 arranged in one column line direction, from among the pixel array 334 shown in FIG. 11, for simplification of description, but descriptions below may be applied to all of the unit pixels included in the pixel array 334 shown in FIG. 11.

Referring to FIGS. 10A and 17, the photo gate driver circuit unit 350 may configure and/or correspond to the photo gate driver circuit unit 33 of the image sensor 1 shown in FIG. 1, but the example embodiments are not limited thereto. The photo gate driver circuit unit 350 may be connected to the plurality of unit pixels PX3 included in the pixel array 334 via a plurality of wirings 360A, 360B, 360C, and 360D, but the example embodiments are not limited thereto.

For example, the photo gate driver circuit unit 350 may include a first photo gate driver 350A for applying the first signal Q1 to the first photo gate PGA, a second photo gate driver 350B for applying the second signal Q2 to the second photo gate PGB, a third photo gate driver 350C for applying the third signal Q3 to the third photo gate PGC, and a fourth photo gate driver 350D for applying the fourth signal Q4 to the fourth photo gate PGD.

The plurality of wirings 360A, 360B, 360C, and 360D include a first wiring 360A, a second wiring 360B, a third wiring 360C, and a fourth wiring 360D. The first wiring 360A may extend from the first photo gate driver 350A to the plurality of unit pixels PX3 arranged in a line along one column line direction. The second wiring 360B may extend from the second photo gate driver 350B to the plurality of unit pixels PX3 arranged in a line along one column line direction. The third wiring 360C may extend from the third photo gate driver 350C to the plurality of unit pixels PX3 arranged in a line along one column line direction. The fourth wiring 360D may extend from the fourth photo gate driver 350D to the plurality of unit pixels PX3 arranged in a line along one column line direction.

The photo gate driver circuit unit 350 may be configured to provide the first to fourth signals Q1, Q2, Q3, and Q4 to the first to fourth photo gates PGA, PGB, PGC, and PGD of the first to fourth taps TA, TB, TC, and TD included in the plurality of unit pixels PX3 of the pixel array 334, via the first to fourth wirings 360A, 360B, 360C, and 360D.

A plurality of first contacts CT1 are provided between the plurality of unit pixels PX3 and the first wiring 360A. A plurality of second contacts CT2 are provided between the plurality of unit pixels PX3 and the second wiring 360B. A plurality of third contacts CT3 are provided between the plurality of unit pixels PX3 and the third wiring 360C. A plurality of fourth contacts CT4 are provided between the plurality of unit pixels PX3 and the fourth wiring 360D.

The first wiring 360A may be connected to the first photo gate PGA of the first tap TA in each of the plurality of unit pixels PX3 that are arranged in a line along one column line direction, via the first contact CT1. The second wiring 360B may be connected to the second photo gate PGB of the second tap TB in each of the plurality of unit pixels PX3 that are arranged in a line along one column line direction, via the second contact CT2. The third wiring 360C may be connected to the third photo gate PGC of the third tap TC in each of the plurality of unit pixels PX3 that are arranged in a line along one column line direction, via the third contact CT3. The fourth wiring 360D may be connected to the fourth photo gate PGD of the fourth tap TD in each of the plurality of unit pixels PX3 that are arranged in a line along one column line direction, via the fourth contact CT4.

As described above with reference to FIG. 11, in two neighboring unit pixels PX3 from among the plurality of unit pixels PX3 arranged in the column line direction, the locations of the first to fourth taps TA, TB, TC, and TD are line-symmetrical with respect to each other based on one line extending in the X direction between the two neighboring unit pixels PX3. Accordingly, locations of the first to fourth contacts CT1, CT2, CT3, and CT4 that are connected to the first to fourth photo gates PGA, PGB, PGC, and PGD of the first to fourth taps TA, TB, TC, and TD included in the two neighboring unit pixels PX3 from among the plurality of unit pixels PX3 arranged in the column line direction are also line-symmetrical with respect to each other based on one line extending in the X direction between the above two neighboring unit pixels PX3.

FIG. 17 shows a configuration in which the first to fourth photo gate drivers 350A, 350B, 350C, and 350D of the photo gate driver circuit unit 350 are connected to the plurality of unit pixels PX3 arranged in a line in the column line direction in the pixel array 334, but the example embodiments are not limited thereto. For example, the first to fourth photo gate drivers 350A, 350B, 350C, and 350D of the photo gate driver circuit unit 350 may be respectively connected to the plurality of unit pixels PX3 arranged in the row line direction in the pixel array 334, in the similar way to the above description.

FIGS. 11 to 17 show an example in which the pixel array 334 includes the third unit pixel PX3 illustrated with reference to FIG. 10A, but one or more example embodiments are not limited thereto. For example, the above descriptions with reference to FIGS. 11 and 17 may be applied to a case where the pixel array 334 includes the unit pixels PX4 illustrated with reference to FIG. 10B.

While the example embodiments of the inventive concepts have been described in detail, it will be apparent to those skilled in the art that various modifications can be made to the above-described example embodiments of the inventive concepts without departing from the scope of the inventive concepts.

While the inventive concepts has been particularly shown and described with reference to example embodiments thereof, it will be understood that various changes in form and details may be made therein without departing from the spirit and scope of the following claims.

What is claimed is:

1. An image sensor comprising:
   a light source configured to output an optical signal onto at least one object;
   a pixel array comprising a plurality of unit pixels, the plurality of unit pixels including at least a first unit pixel and a second unit pixel that are adjacent to each other, each of the plurality of unit pixels comprising,
      a photoelectric conversion region configured to receive a reflected optical signal reflected off of the object in response to the output optical signal,
      a plurality of photo gates configured to receive a plurality of signals, phase differences of the plurality of signals being different from one another;
   the first unit pixel and the second unit pixel being adjacent to each other, and the first unit pixel and the second unit pixel each comprise,
      a first tap including a first photo gate, and the first tap configured to receive a first signal having a first phase difference with respect to the optical signal, and
      a second tap including a second photo gate, and the second tap configured to receive a second signal having a second phase difference with respect to the optical signal, the second phase difference being different from the first phase difference; and
      a location of the first tap in the first unit pixel and a location of the first tap in the second unit pixel, and a location of the second tap in the first unit pixel and a location of the second tap in the second unit pixel, are symmetrical with each other based on one point between the first unit pixel and the second unit pixel.

2. The image sensor of claim 1, wherein the first unit pixel and the second unit pixel are adjacent to each other in a direction along one of a row line or a column line of the plurality of unit pixels.

3. The image sensor of claim 1, wherein the first unit pixel and the second unit pixel are adjacent to each other in a direction along a diagonal line corresponding to each of the first unit pixel and the second unit pixel.

4. The image sensor of claim 1, wherein each of the first unit pixel and the second unit pixel further comprises:
   a third tap including a third photo gate, the third tap configured to receive a third signal having a third phase difference with respect to the optical signal;

a fourth tap including a fourth photo gate, the fourth tap configured to receive a fourth signal having a fourth phase difference with respect to the optical signal, the first to fourth phase differences having different values from one another; and a location of the third tap in the first unit pixel and a location of the third tap in the second unit pixel, and a location of the fourth tap in the first unit pixel and a location of the fourth tap in the second unit pixel, are symmetrical with each other based on the one point between the first unit pixel and the second unit pixel.

5. The image sensor of claim 4, wherein
the first unit pixel and the second unit pixel are adjacent to each other in a direction along one of a row line or a column line of the plurality of unit pixels; and
a location of the first tap in the first unit pixel and a location of the first tap in the second unit pixel, a location of the second tap in the first unit pixel and a location of the second tap in the second unit pixel, a location of the third tap in the first unit pixel and a location of the third tap in the second unit pixel, and a location of the fourth tap in the first unit pixel and a location of the fourth tap in the second unit pixel, are line-symmetrical with each other based on one straight line between the first unit pixel and the second unit pixel.

6. The image sensor of claim 4, wherein
the first unit pixel and the second unit pixel are adjacent to each other in a direction along a diagonal line of the first unit pixel or the second unit pixel; and
a location of the first tap in the first unit pixel and a location of the first tap in the second unit pixel, a location of the second tap in the first unit pixel and a location of the second tap in the second unit pixel, a location of the third tap in the first unit pixel and a location of the third tap in the second unit pixel, and a location of the fourth tap in the first unit pixel and a location of the fourth tap in the second unit pixel, are point-symmetrical with each other based on one point on the diagonal line between the first unit pixel and the second unit pixel.

7. The image sensor of claim 4, wherein the first unit pixel and the second unit pixel are respectively configured to:
receive signals having phase differences corresponding to their respective photo gates, values of which sequentially increase along a circulation path in one of a clockwise direction and a counter-clockwise direction; and
apply the received signals to their respective photo gates.

8. The image sensor of claim 4, wherein
the first to fourth photo gates of the first unit pixel are configured to receive signals having phase differences, values of which sequentially increase along a first circulation path in a clockwise direction; and
the first to fourth photo gates of the second unit pixel are configured to receive signals having phase differences, values of which sequentially increase along a second circulation path in a counter-clockwise direction.

9. The image sensor of claim 1, wherein
the plurality of unit pixels further include at least a third unit pixel and a fourth unit pixel;
the pixel array is a 2×2 pixel array including the first unit pixel, the second unit pixel, the third unit pixel, and the fourth unit pixel;
each of the third unit pixel and the fourth unit pixel includes, a third tap including a third photo gate, the third tap configured to receive a third signal having a third phase difference with respect to the optical signal, and
a fourth tap including a fourth photo gate, the fourth tap configured to receive a fourth signal having a fourth phase difference with respect to the optical signal, the first to fourth phase differences having different values from one another; and
a location of the third tap in the third unit pixel and a location of the third tap in the fourth unit pixel, and a location of the fourth tap in the third unit pixel and a location of the fourth tap in the fourth unit pixel, are symmetrical with each other based on one point between the third unit pixel and the fourth unit pixel.

10. The image sensor of claim 9, wherein the third unit pixel and the fourth unit pixel are each configured to:
receive the third signal and the fourth signal; and
apply the third signal to the third photo gate and apply the fourth signal to the fourth photo gate while the first signal is applied to the first photo gate and the second signal is applied to the second photo gate.

11. The image sensor of claim 1, further comprising:
a photo gate driver circuit unit including a plurality of photo gate drivers configured to provide the plurality of signals to the plurality of photo gates: and
a first photo gate driver selected from among the plurality of photo gate drivers is connected to one of the plurality of photo gates included in the first unit pixel and one of the plurality of photo gates included in the second unit pixel.

12. The image sensor of claim 1, further comprising:
a photo gate driver circuit unit including a first photo gate driver and a second photo gate driver, the first photo gate driver configured to provide the first signal to the first photo gate, and the second photo gate driver configured to provide the second signal to the second photo gate;
a first wiring connected from the first photo gate driver to the first unit pixel and the second unit pixel;
a second wiring connected from the second photo gate driver to the first unit pixel and the second unit pixel;
a plurality of first contacts connected between the first photo gates of the first unit pixel and the second unit pixel and the first wiring;
a plurality of second contacts connected between the second photo gates of the first unit pixel and the second unit pixel and the second wiring; and
a location of the first contact connected to the first unit pixel and a location of the first contact connected to the second unit pixel, and a location of the second contact connected to the first unit pixel and a location of the second contact connected to the second unit pixel, are symmetrical with each other based on a point between the first unit pixel and the second unit pixel.

13. An image sensor comprising:
a light source configured to output an optical signal onto an object; and
a pixel array comprising a plurality of unit pixels, the plurality of unit pixels including at least a first unit pixel, a second unit pixel, a third unit pixel, and a fourth unit pixel, and
the first unit pixel, the second unit pixel, the third unit pixel, and the fourth unit pixel arranged in a 2×2 array arrangement;
each of the plurality of unit pixels comprising, a photoelectric conversion region configured to receive a reflected optical signal reflected off of the object in response to the output optical signal, a plurality of photo gates configured to receive a plurality of signals, phase differences of plurality of signals being different from one another;

each of the first unit pixel and the second unit pixel being adjacent to each other in a direction along a first diagonal line, and each of the first unit pixel and the second unit pixel including, a first tap including a first photo gate, the first tap configured to receive a first signal having a first phase difference with respect to the optical signal, and a second tap including a second photo gate, the second tap configured to receive a second signal having a second phase difference with respect to the optical signal, the second phase difference being different from the first phase difference; and a location of the first tap in the first unit pixel and a location of the first tap in the second unit pixel, and a location of the second tap in the first unit pixel and a location of the second tap in the second unit pixel, are point-symmetrical with each other based on a first point on the first diagonal line.

14. The image sensor of claim 13, wherein
the first to fourth unit pixels each are a 2-tap unit pixel;
the third unit pixel and the fourth unit pixel are adjacent to each other in a direction along a second diagonal line in the 2×2 array;
each of the third unit pixel and the fourth unit pixel include,
a third tap having a third photo gate, the third tap configured to receive a third signal having a third phase difference with respect to the optical signal, and
a fourth tap having a fourth photo gate, the fourth tap configured to receive a fourth signal having a fourth phase difference with respect to the optical signal, the first to fourth phase differences having different values from one another; and
a location of the third tap in the third unit pixel and a location of the third tap in the fourth unit pixel, and a location of the fourth tap in the third unit pixel and a location of the fourth tap in the fourth unit pixel, are point-symmetrical with each other based on a second point on the second diagonal line.

15. The image sensor of claim 13, wherein
each of the first to fourth unit pixels are a 4-tap unit pixel;
each of the first unit pixel and the second unit pixel includes,
a third tap including a third photo gate, the third tap configured to receive a third signal having a third phase difference with respect to the optical signal, and
a fourth tap including a fourth photo gate, the fourth tap configured to receive a fourth signal having a fourth phase difference with respect to the optical signal, the first to fourth phase differences having different values from one another; and
a location of the third tap in the first unit pixel and a location of the third tap in the second unit pixel, and a location of the fourth tap in the first unit pixel and a location of the fourth tap in the second unit pixel, are point-symmetrical with each other based on the first point.

16. The image sensor of claim 15, wherein
the third unit pixel and the fourth unit pixel are adjacent to each other in a direction along a second diagonal line in the 2×2 array;
each of the third unit pixel and the fourth unit pixel includes a first tap, a second tap, a third tap, and a fourth tap; and
locations of the first to fourth taps in the third unit pixel and locations of the first to fourth taps in the fourth unit pixel are point-symmetrical with each other based on a second point on the second diagonal line.

17. The image sensor of claim 13, wherein
each of the first to fourth unit pixels are a 4-tap unit pixel;
each of the first to fourth unit pixels includes the first tap, the second tap, a third tap, and a fourth tap,
the third tap including a third photo gate, the third tap configured to receive a third signal having a third phase difference with respect to the optical signal, and
the fourth tap including a fourth photo gate, the fourth tap configured to receive a fourth signal having a fourth phase difference with respect to the optical signal, the first to fourth phase differences having different values from one another; and
locations of the first to fourth taps in the first unit pixel and locations of the first to fourth taps of the third unit pixel are line-symmetrical with each other based on a first straight line between the first unit pixel and the third unit pixel;
locations of the first to fourth taps in the first unit pixel and locations of the first to fourth taps of the fourth unit pixel are line-symmetrical with each other based on a second straight line between the first unit pixel and the fourth unit pixel;
locations of the first to fourth taps in the second unit pixel and locations of the first to fourth taps of the third unit pixel are line-symmetrical with each other based on a third straight line between the second unit pixel and the third unit pixel; and
locations of the first to fourth taps in the second unit pixel and locations of the first to fourth taps of the fourth unit pixel are line-symmetrical with each other based on a fourth straight line between the second unit pixel and the fourth unit pixel.

18. An image sensor comprising:
a light source configured to output an optical signal onto an object;
a pixel array comprising a plurality of unit pixels, the plurality of unit pixels including at least a first unit pixel and a second unit pixel, each of the plurality of unit pixels having a multi-tap structure, and each of the plurality of unit pixels configured to output a plurality of pixel signals corresponding to receiving a reflected optical signal reflected off of the object in response to the output optical signal; and
a photo gate driver circuit unit comprising a plurality of photo gate drivers, the photo gate driver circuit configured to provide a plurality of signals having different phase differences from one another to the plurality of unit pixels;
the first unit pixel and the second unit pixel are adjacent to each other;
the first unit pixel and the second unit pixel each include,
a first tap including a first photo gate, the first tap configured to receive a first signal having a first phase difference with respect to the optical signal, and a second tap including a second photo gate, the second tap configured to receive a second signal having a second phase difference with respect to the optical signal, the second phase difference being different from the first phase difference; and a location of the first tap in the first unit pixel and a location of the first tap in the second unit pixel, and a location of the second tap in the first unit pixel and a location of the second tap in the second unit pixel, are symmetrical with each other based on one point between the first unit pixel and the second unit pixel.

19. The image sensor of claim 18, further comprising:

a first photo gate driver selected from among the plurality of photo gate drivers is connected to the first unit pixel and the second unit pixel via one wiring; and the first photo gate driver is configured to simultaneously apply signals having the same phase difference to the first unit pixel and the second unit pixel.

20. The image sensor of claim 18, wherein the photo gate driver circuit unit comprises a first photo gate driver and a second photo gate driver, the first photo gate driver is configured to provide the first signal to the first photo gate in each of the first unit pixel and the second unit pixel, and the second photo gate driver is configured to provide the second signal to the second photo gate in each of the first unit pixel and the second unit pixel; and a location of a first contact between the first photo gate in the first unit pixel and the first photo gate driver and a location of a second contact between the first photo gate in the second unit pixel and the first photo gate driver, are symmetrical with each other based on the one point between the first unit pixel and the second unit pixel; and a location of a third contact between the second photo gate in the first unit pixel and the second photo gate driver and a location of a fourth contact between the second photo gate in the second unit pixel and the second photo gate driver, are symmetrical with each other based on the one point between the first unit pixel and the second unit pixel.

\* \* \* \* \*